US011157113B2

(12) United States Patent
Winkler et al.

(10) Patent No.: US 11,157,113 B2
(45) Date of Patent: Oct. 26, 2021

(54) SELF-MIXING INTERFERENCE BASED SENSORS FOR CHARACTERIZING TOUCH INPUT

(71) Applicant: Apple Inc., Cupertino, CA (US)

(72) Inventors: Mark T. Winkler, San Jose, CA (US);
Mehmet Mutlu, Stanford, CA (US);
Omid Momtahan, Palo Alto, CA (US);
Tong Chen, Cupertino, CA (US);
Wenrui Cai, San Jose, CA (US); Chau H. Nguyen, San Jose, CA (US);
Giovanni Gozzini, Berkeley, CA (US);
Michael K. McCord, San Francisco, CA (US); Orit A. Shamir, San Francisco, CA (US); Prashanth S. Holenarsipur, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/383,036

(22) Filed: Apr. 12, 2019

(65) Prior Publication Data
US 2019/0317639 A1    Oct. 17, 2019

Related U.S. Application Data

(60) Provisional application No. 62/657,576, filed on Apr. 13, 2018, provisional application No. 62/702,264, filed on Jul. 23, 2018.

(51) Int. Cl.
*G06F 3/042*    (2006.01)
*G01B 11/16*    (2006.01)
(Continued)

(52) U.S. Cl.
CPC ........ *G06F 3/0421* (2013.01); *G01B 9/02092* (2013.01); *G01B 11/161* (2013.01);
(Continued)

(58) Field of Classification Search
CPC ........ G06F 3/042–0428; G06F 3/0488–04886; G06F 3/04845; G06F 3/0486;
(Continued)

(56) References Cited

U.S. PATENT DOCUMENTS 6,301,968 B1 * 10/2001 Maruyama .............. G01S 17/58
356/484
6,707,027 B2   3/2004 Liess et al.
(Continued)

FOREIGN PATENT DOCUMENTS

| CH | 706101 | 12/1978 |
|---|---|---|
| WO | WO 10/001299 | 1/2010 |
| WO | WO 17/178711 | 10/2017 |

OTHER PUBLICATIONS

U.S. Appl. No. 16/141,888, filed Sep. 25, 2018, Mutlu et al.
(Continued)

*Primary Examiner* — David Tung
(74) *Attorney, Agent, or Firm* — Brownstein Hyatt Farber Schreck, LLP

(57) ABSTRACT

Disclosed herein are electronic devices having touch input surfaces. A user's touch input or press on the touch input surface is detected using a set of lasers, such as vertical-cavity surface-emitting lasers (VCSELs) that emit beams of light toward the touch input surface. The user's touch causes changes in the self-mixing interference within the VCSEL of the emitted light with reflected light, such as from the touch input surface. Deflection and movement (e.g., drag motion) of the user's touch is determined from detected changes in the VCSELs' operation due to the self-mixing interference.

14 Claims, 25 Drawing Sheets

(51) Int. Cl.
*G01B 9/02* (2006.01)
*G01S 17/50* (2006.01)
*G01P 3/36* (2006.01)
*H01S 5/183* (2006.01)

(52) U.S. Cl.
CPC .............. *G01P 3/366* (2013.01); *G01S 17/50* (2013.01); *H01S 5/18386* (2013.01)

(58) Field of Classification Search
CPC ... G01B 9/02092; G01B 11/161; G01S 17/50; G01P 3/366; G01P 3/36; H01S 5/18386; H01S 5/0656; H01S 5/0028; H01S 5/423
See application file for complete search history.

(56) References Cited

U.S. PATENT DOCUMENTS

| | | | |
|---|---|---|---|
| 6,816,523 | B1 | 11/2004 | Glenn et al. |
| 7,557,795 | B2 | 7/2009 | Kong et al. |
| 7,995,193 | B2 | 8/2011 | Kuwata |
| 8,529,460 | B2 | 9/2013 | Kawano et al. |
| 9,453,939 | B2 | 9/2016 | Tortora et al. |
| 9,547,280 | B2 | 1/2017 | Born et al. |
| 2002/0104957 | A1* | 8/2002 | Liess ............... G01S 7/4916 250/221 |
| 2005/0157971 | A1* | 7/2005 | Juijve ............... G06F 1/1643 385/12 |
| 2005/0243053 | A1* | 11/2005 | Liess ............... G06F 3/0421 345/156 |
| 2006/0152494 | A1* | 7/2006 | Liess ............... G06F 1/1662 345/169 |
| 2007/0013661 | A1* | 1/2007 | Theytaz ............... G06F 3/03543 345/166 |
| 2008/0225300 | A1* | 9/2008 | Schemmann ......... G06F 3/0421 356/450 |
| 2008/0240185 | A1* | 10/2008 | Sai ............... B41J 2/473 372/38.01 |
| 2012/0160031 | A1* | 6/2012 | Van Steenberge ........ G01L 1/24 73/800 |
| 2015/0070685 | A1* | 3/2015 | Koos ............... G01B 11/026 356/28.5 |
| 2016/0004385 | A1* | 1/2016 | Chikaoka ............... G06F 3/0416 345/175 |
| 2018/0080758 | A1 | 3/2018 | Chen et al. |
| 2018/0224368 | A1 | 8/2018 | Spruit et al. |
| 2019/0331473 | A1* | 10/2019 | Johnson ............... G01S 7/4814 |

OTHER PUBLICATIONS

U.S. Appl. No. 16/141,912, filed Sep. 25, 2018, Mutlu et al.
U.S. Appl. No. 16/230,967, filed Dec. 21, 2018, Huang et al.
U.S. Appl. No. 16/379,551, filed Apr. 9, 2019, Holenarsipur et al.
Guo et al., "Self-mixing interferometer based on sinusoidal phse modulating technique," *Optics Express*, vol. 13, No. 5, Mar. 7, 2005, pp. 1537-1543.
Liess et al., "A miniaturized multidirectional optical motion sensor and input device based on laser self-mixing," *Measurement Science and Technology*, vol. 13, 2002, pp. 2001-2006.
Lim et al, "Displacement and Distance Measurement Using the Change in Junction Voltage Across a Laser Diode due to the Self-Mixing Effect," Proceeding of SPIE, vol. 6038, 603810, 2006, 10 pages.

* cited by examiner

SELF-MIXING INTERFERENCE BASED SENSORS FOR CHARACTERIZING TOUCH INPUT

CROSS-REFERENCE TO RELATED APPLICATIONS

This application is a nonprovisional of and claims the benefit under 37 U.S.C. § 119(e) of U.S. Provisional Patent Application No. 62/657,576, filed on Apr. 13, 2018, and U.S. Provisional Patent Application No. 62/702,264, filed on Jul. 23, 2018, the contents of which are incorporated by reference as if fully disclosed herein.

FIELD

The present disclosure generally relates to sensing or characterizing touch input provided on an electronic device by a user of the electronic device (e.g., gestures made by a finger or stylus on a cover glass positioned over a display of the electronic device).

BACKGROUND

Electronic devices are commonplace in today's society. Examples of electronic devices include mobile devices, such as cell phones, tablet or laptop computers, watches, and so on, and non-mobile devices, such as electronic kiosks, automated teller machines, desktop computers, and so on. Such electronic devices may include buttons, switches, touch input surfaces, or other components through which a user may provide inputs or commands to the electronic device.

Touch screens and other user input surfaces can provide a means to receive user input into an electronic device. In some cases, a user input surface (also referred to as a "touch input surface") may overlay a display of an electronic device (e.g., a user input surface may overlay a display of virtual buttons or icons, hyperlinks, text, images, and the like). A user may interact with such a display by touching or pressing the user input surface using one or more fingers (or a stylus). The electronic device may detect the touch or press using various types of sensors, such as touch sensors or force sensors. A sensor may detect touch or force using various technologies, and in some cases may employ capacitive sensing, resistive sensing, ultrasonic sensing, or optical sensing.

Sensors that employ optical sensing may detect the deflection of a user input surface caused by a user's press, or may detect a percentage of emitted light reflected by a user's finger or stylus.

SUMMARY

This summary is provided to introduce a selection of concepts in a simplified form that are further described below in the Detailed Description section. This summary is not intended to identify key features or essential features of the claimed subject matter, nor is it intended to be used as an aid in determining the scope of the claimed subject matter.

Disclosed herein are devices, systems, and methods that use lasers to detect user input on a touch screen or other user input surface of the electronic device. Disclosed arrangements of lasers can be used to detect lateral or up and down motion of a user's finger or stylus on a user input surface. In some embodiments the lasers may include vertical-cavity surface-emitting lasers (VCSELs), edge-emitting lasers, vertical external cavity surface-emitting lasers (VECSELs), or quantum-dot lasers (QDLs). In some embodiments, deflection of a user input surface may be detected and characterized by analyzing an interference signal produced when coherent light generated and emitted by a laser reflects from the user input surface, is received back into the laser, and is coherently mixed with the light generated within the laser cavity. As used herein, "light" will refer not just to visible light frequencies, but will include other frequencies of electromagnetic radiation, such as infrared, ultraviolet, or other frequency ranges. "Laser light" will refer to electromagnetic radiation emitted from an amplified resonant cavity.

More specifically, described herein is an electronic device having a user input surface and a set of lasers (e.g., VCSELs). The VCSELs may emit respective beams of coherent light toward the user input surface, or toward another surface or even a photodetector, as explained in the embodiments below. The surface or object toward which the laser's coherent light is directed will hereinafter be referred to generally as the "target." Each VCSEL's beam of coherent light can include a first amount of coherent light generated by the VCSEL and a second amount of coherent light reflected from the user input surface or target into the VCSEL and mixed with the first amount of coherent light inside the laser cavity. A first beam of coherent light emitted by a first VCSEL may intersect the user input surface at a right angle. A second beam of coherent light emitted by a second VCSEL may intersect the user input surface at a first acute angle in a first plane. A third beam of coherent light emitted by a third VCSEL may intersect the user input surface at a second acute angle in a second plane that differs from the first plane. The electronic device also has a set of sensors configured to measure interferometric parameters associated with the beams of coherent light. The measured interferometric parameters can be used to characterize a movement of a user input on the user input surface and a deflection of the user input surface.

In related embodiments, the second and third VCSELs may be associated with respective lenses—or another beam shaping surface element with reflective, refractive, or diffractive properties—configured to direct the respective beams of coherent light to intersect the user input surface at the respective acute angle. The interferometric parameters can include a junction voltage of a VCSEL, a change in power of the VCSEL, a variation in the supply voltage for the VCSEL, bias current of a VCSEL, or another interferometric parameter.

In related embodiments, the electronic device can include a photodetector corresponding to a VCSEL that is configured to detect reflections of the VCSEL's beam. Interferometric parameters can be detected from an output of the photodetector, such as a current output or a voltage output. The photodetector may be positioned beneath the VCSEL, i.e., on the side of the VCSEL opposite the surface from which the beam is emitted. In a second configuration, the photodetector is integrated into the VCSEL. In a third alternative, the photodetector can be placed adjacent the VCSEL. Other configurations are discussed in relation to FIGS. 2A-F.

In a first category of embodiments, signals of the interferometric parameters can be analyzed using a spectrum-based analysis, from which a speed and direction of the movement can be inferred. In some embodiments the speed can be calculated from the fundamental harmonic frequency found by the spectrum analysis, and the direction of the movement can be calculated from a phase change in the second harmonic frequency found by the spectrum analysis. Such embodiments are discussed in relation to FIGS. 7A-B.

In a second category of embodiments, signals of the interferometric parameters can be analyzed using a time domain based analysis, from which a speed and direction of the movement may also be inferred. A moving target may create a distorted sinusoidal behavior of an interferometric parameter, whose time domain signal may be measured using, e.g., threshold detectors. Measured properties of the time domain signal may include duty cycle, interference fringes, and times between leading and falling edges of the threshold detectors having inputs of the time domain signal. Such embodiments are discussed in relation to FIGS. 8A-C.

The present disclosure also describes an electronic device having a touch input surface; first, second, and third lasers within the electronic device, which lasers are configured to emit respective coherent light toward the touch input surface; and a set of sensors configured to detect a respective property of each of the first, second, and third emitted coherent light. The second and third lasers may be configured non-collinearly with respect to the first laser. The first detected property of the first coherent light may be used to detect a user-caused deflection of the touch input surface, the deflection being perpendicular to the touch input surface. The second detected property of the second coherent light may be used at least in part to detect a lateral movement or motion of the user-caused deflection of the touch input surface, in a first direction, and a third detected property of the third coherent light emitted may be used at least in part to detect a lateral movement of the user-caused deflection of the touch input surface in a second direction, with the second direction being different from the first direction.

In related embodiments, a detected property of any of the coherent light can be an interferometric parameter or property, such as a junction voltage, bias current of a VCSEL, a power supply voltage, or a power output of the respective laser. In embodiments that make use of a photodetector, the interferometric parameter may be an output current, voltage, or power of the photodetector.

The electronic device may also include, internally, one or more photodetectors, each photodetector being associated to a respective laser. One or more of the lasers may be a VCSEL. One or more of the coherent lights may be reflected and undergo self-mixing interference within the VCSEL. For electronic devices using more than one laser and/or photodetector pair, the lasers may use time-multiplexing of coherent light emission in order to reduce crosstalk.

The lateral motions and the deflection of the touch input surface may be determined using a spectrum analysis of at least one of the detected properties, a time domain analysis of the detected properties, or both.

The present disclosure also describes a method of detecting a user input on a touch input surface of an electronic device. The method includes emitting first, second, and third coherent light beams from respective first, second, and third VCSELs that are internal to the electronic device. The method includes applying a sinusoidal modulation to a bias current of at least one of the first, second, and third VCSELs, at a modulation frequency, and measuring a signal of an interferometric parameter associated with the at least one of the first, second, or third VCSELs. The method may also include: determining a first value by demodulating the signal of the interferometric parameter at the modulation frequency; determining a second value by demodulating the signal of the interferometric parameter at twice the modulation frequency; and determining a displacement of the touch input surface using the first value and the second value

BRIEF DESCRIPTION OF THE DRAWINGS

The disclosure will be readily understood by the following detailed description in conjunction with the accompanying drawings, wherein like reference numerals designate like structural elements.

Figure 1A:
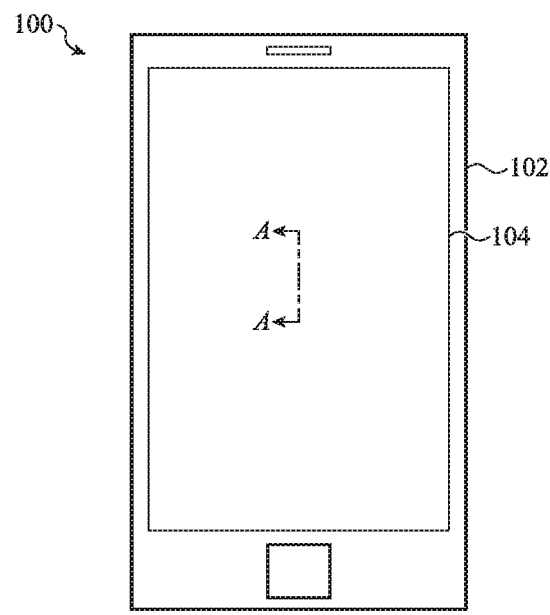
FIG. 1A illustrates an example electronic device that may include at least one of the embodiments.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The embodiments described herein are directed to electronic devices having user input surfaces (e.g., touch input surfaces) that a user may touch or press to interact with the electronic device. Examples of electronic devices with such surfaces include mobile devices such as smartphones and tablet computers, and non-mobile devices such as ATMs and electronic kiosks. Touch input surfaces may in some cases cover displays by which electronic devices present information such as text, icons, or virtual buttons to a user. A user can input commands to such electronic devices by pressing the touch input surface at a location of an icon or other graphical element. The touch or press can be a continuous "drag" input in which, for example, a finger of the user maintains a pressure on the touch input surface and moves a lateral distance across the touch input surface. A better user experience for such an electronic device may be obtained when the electronic device is better able to distinguish user input from sources that could cause a false detection of user input.

The embodiments described herein include devices, components, and methods of using lasers to detect a user's touch or press on a touch screen, display screen, touch input surface, or other user input surface. Terms such as touch input surface, touch screen, and user input surface are used equivalently herein to refer to a surface of an electronic device through which a user of the electronic device can interact with the electronic device by applying a touch or press.

A particular type of laser that is used in various embodiments is a VCSEL. Many conventional lasers, such as edge-emitting laser diodes, are often fabricated so that the lasing cavity is directed horizontally with respect to the fabrication wafer, making it difficult to test the lasers before dicing and mounting. With VCSELs, the lasing cavity is directed vertically with respect to the fabrication wafer, allowing for on-wafer testing. Further, an advantage to VCSELs for the embodiments described herein is that they can be easily mounted on, for example, a substrate so that the emitted laser light is directed toward a target or user input surface. Reflections of the emitted light can be received back into the lasing cavity to create a phenomenon of self-mixing interference. Some conventional lasers or edge-emitting laser diodes may also be able to receive laser light back into their laser cavity and undergo self-mixing. While this description will for the most part describe the embodiments in terms of laser systems that use VCSELs, the embodiments described herein may also be implemented using edge-emitting laser diodes or other types of lasers capable of undergoing self-mixing interference of generated and received coherent light.

Self-mixing interference alters the emitted coherent light beam in at least two ways. First, the wavelength of the emitted coherent light with self-mixing interference is shifted from the wavelength that would be emitted by the VCSEL without the self-mixing interference. Second, the optical power of the emitted coherent light with self-mixing interference can also be changed.

Self-mixing interference can alter performance properties or parameters of a VCSEL or its emitted coherent light in ways that can be detected. Such parameters include (but are not limited to) changes in a junction voltage, a bias current, a supply voltage, or a power output. These alterable performance properties or parameters are referred to herein as interferometric parameters associated with the coherent light of the VCSEL. Further, self-mixing interference is dependent on the distance between the target and the lasing cavity, such that the distance may be correlated to the interferometric parameters and/or changes in the interferometric parameters.

To detect a press on a user input surface, the user input surface, in one set of embodiments, is able to deflect in response to the press. A laser within an electronic device may be configured to emit a coherent light beam toward the user input surface such that the coherent light beam intersects an interior side of the user input surface. The laser may receive an altered reflected light that, in turn, alters the self-mixing interference. The deflection thus can result in a detectable change in an interferometric parameter, which can then be interpreted by the electronic device (e.g., as a user input, or as a particular type of user input, such as a particular gesture). In another set of embodiments, the user input surface is rigid, but supported on structures that are able to deflect, so that a distance between the VCSEL and the user input surface changes, altering the self-mixing interference. In yet another set of embodiments, the user input surface is transparent, at least partially, so that a user's finger or stylus impressed on or near the user input surface alters the self-mixing interference. Examples of these sets of embodiments will be explained in relation to FIGS. 2A-F below.

The electronic device may also include one or more photodetectors (or equivalently "photoreceptor" or "photosensor"), in addition to the lasers, for detection of the user applied pressure on the user input surface. In some embodiments, a photodetector may be placed adjacent to a corresponding laser on a substrate. In still other embodiments, the photodetector may be placed between the substrate and the laser, placed in line with the laser, or integrated with the laser.

In some embodiments, further properties of the user-caused deflection may be detectable based on changes in the interferometric parameters. In some embodiments, the motion properties, such as direction and/or speed of the deflection, can be detected. Considering the deflecting surface as a target moving toward or away from the laser emitting the coherent light, the target's movement can produce a Doppler shift in the wavelength of the reflected light. This shift also affects the self-mixing interference, leading to detectable changes in the interferometric parameters or properties associated with the laser and/or its emitted light. As the target moves toward the laser, the power (or other measurable parameter) undergoes an oscillation. The oscillation can have the form of a sinusoid or a distorted sinusoid, as explained below. For example, in the case of a weakly reflecting target, a change in power is often related to the change in distance from the target by $\Delta P \propto \cos(4\pi L/\lambda)$, where L is the distance target from the laser, and $\lambda$ is the wavelength of the laser light. For a strongly reflecting target, the power function is a distorted sinusoid, and higher harmonics are present. The higher harmonics can be analyzed to provide information about the position and movement of the target. As a moving deflection may cause L to vary on the scale of µ-meters, and $\lambda$ is on the scale of 100's of nanometers, the sinusoid goes through a large number of periods. By sampling the interferometric parameter and performing a spectrum analysis (e.g., using a Fast Fourier Transform (FFT)), the fundamental frequency and its higher harmonics can be obtained. The speed of movement of the target can be obtained from the fundamental frequency. The direction of the movement can be obtained from a phase shift that occurs at the second harmonic.

Additionally and/or alternatively, a time domain analysis of the interferometric parameter's signal may be performed. A circuit containing a pair of comparators may receive the signal. The rising side of the signal's oscillations can initially exceed a first threshold (causing the first comparator to trigger, or turn "on") and subsequently exceed the second threshold, (causing the second comparator to turn "on"). During the falling side of the signal's oscillations, the second comparator turns "off," followed by the first comparator turning "off." A difference between the time interval between the turn on times, and the time interval between the two turn off times can be used to infer the motion and direction of the target.

The time domain analysis can also be used to detect an initiation of a user input. As the user input surface, or other form of the target, is initially displaced, the velocity of the target increases. The increase in velocity from zero can cause the interferometric parameter's signal to alternately exceed both comparator thresholds, then fall below both thresholds. Such a change over both thresholds from a quiescent state of the signal can indicate a start of a user input. This can trigger the electronic device to awake from an idle state.

Whether by a spectrum analysis or a time domain analysis, the ability to detect speed and direction can be used to detect a user's drag motion on the touch input surface. In some embodiments, three lasers may be arranged on a substrate in a non-collinear pattern. For example, the three lasers can be positioned to form a right angle between the line formed by a first laser and a second laser, and the line formed between the first laser and a third laser. In other embodiments, the angle between the two lines may be other than a right angle. The first (vertex) laser can be used to detect deflection of the press or touch into (i.e., normal to) the touch input surface, and the second and third lasers can be used to detect lateral movement of the deflection (i.e., a drag motion) across the touch input surface in separate directions.

The lasers may have lenses placed on or near the coherent light emitting apertures of the lasers. Such lenses can be used, for example, with at least the second and third lasers in the configuration just discussed. In embodiments in which the lasers are mounted on a substrate so that their emitted coherent light beams are directed perpendicular to the substrate, the lenses can bend the directions of the light beams. This can be used, in part, to determine a direction of movement of the drag motion on the touch input surface.

These and other embodiments are discussed below with reference to FIGS. 1A-12. However, those skilled in the art will readily appreciate that the detailed description given herein with respect to these figures is for explanatory purposes only and should not be construed as limiting.

FIG. 1A illustrates an example electronic device 100 that can incorporate or use components, systems, or methods for detecting user inputs on a touch input surface. The device shown in FIG. 1A may be a smartphone, such as an iPhone. Other examples of devices that can make use of the embodiments described herein include a computer mouse or touchpad, and a TV remote. Other examples are possible. The electronic device 100 may include a case 102 that contains internal electronics, such as a power source (e.g., a battery), a processor and associated memory, a radio transceiver, and other components. The electronic device may also have a display surface 104 for presenting information to a user.

The display surface 104 may be touch sensitive and function as a user input surface to receive input commands from a user. The user can input commands on the display surface 104 by applying local pressure such as by one or more fingers, a stylus, or other contact device. Associated with the display surface 104 can be a laser system, as explained below, for detecting user touches on the display surface.

Figure 1B:
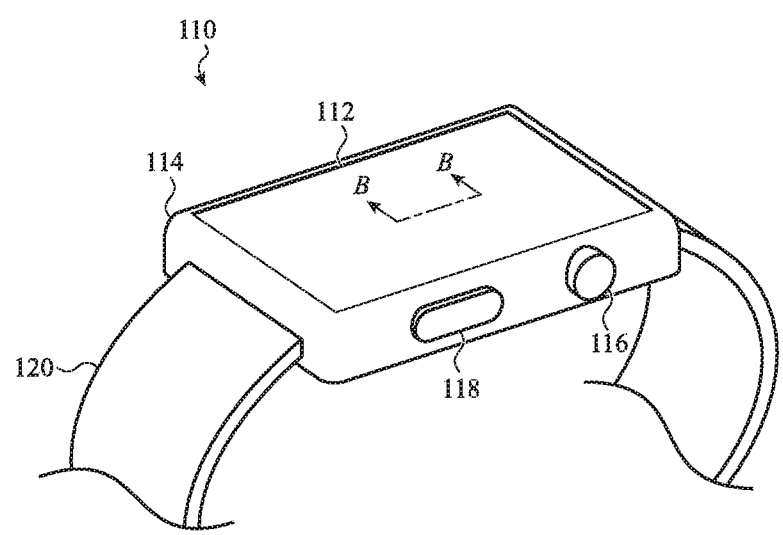
FIG. 1B illustrates an example electronic device that may include at least one of the embodiments.

FIG. 1B shows a second example of an electronic device 110 that can incorporate or use components, systems, or methods for detecting user inputs on a user input surface. In this example the electronic device 110 may be an electronic watch. The electronic device 110 may include a housing 114 having a display surface 112. The electronic device 110 can be worn by a user with the wrist band 120 (only partially shown). The electronic device 110 can include one or more buttons 118 and/or a crown 116. The housing 114 may include the internal electronics of the electronic device 110, such as a power source (e.g., a battery), a processor and associated memory, a radio transceiver, and other components.

The display surface 112 of the electronic device 110 may present information such as text, icons, and the like to a user. The display surface 112 may be touch sensitive and function as a touch input surface for receiving inputs from the user. The display surface 112 may include a cover glass over internal components and systems. The cover glass may be transparent. In some embodiments, the cover glass may deflect upon a press by the user, such as by a finger or a stylus. The applied press may be detected by force sensors. The deflection caused by the applied press may also or alternatively be detected using a laser system, as in the embodiments described herein.

Figure 10:
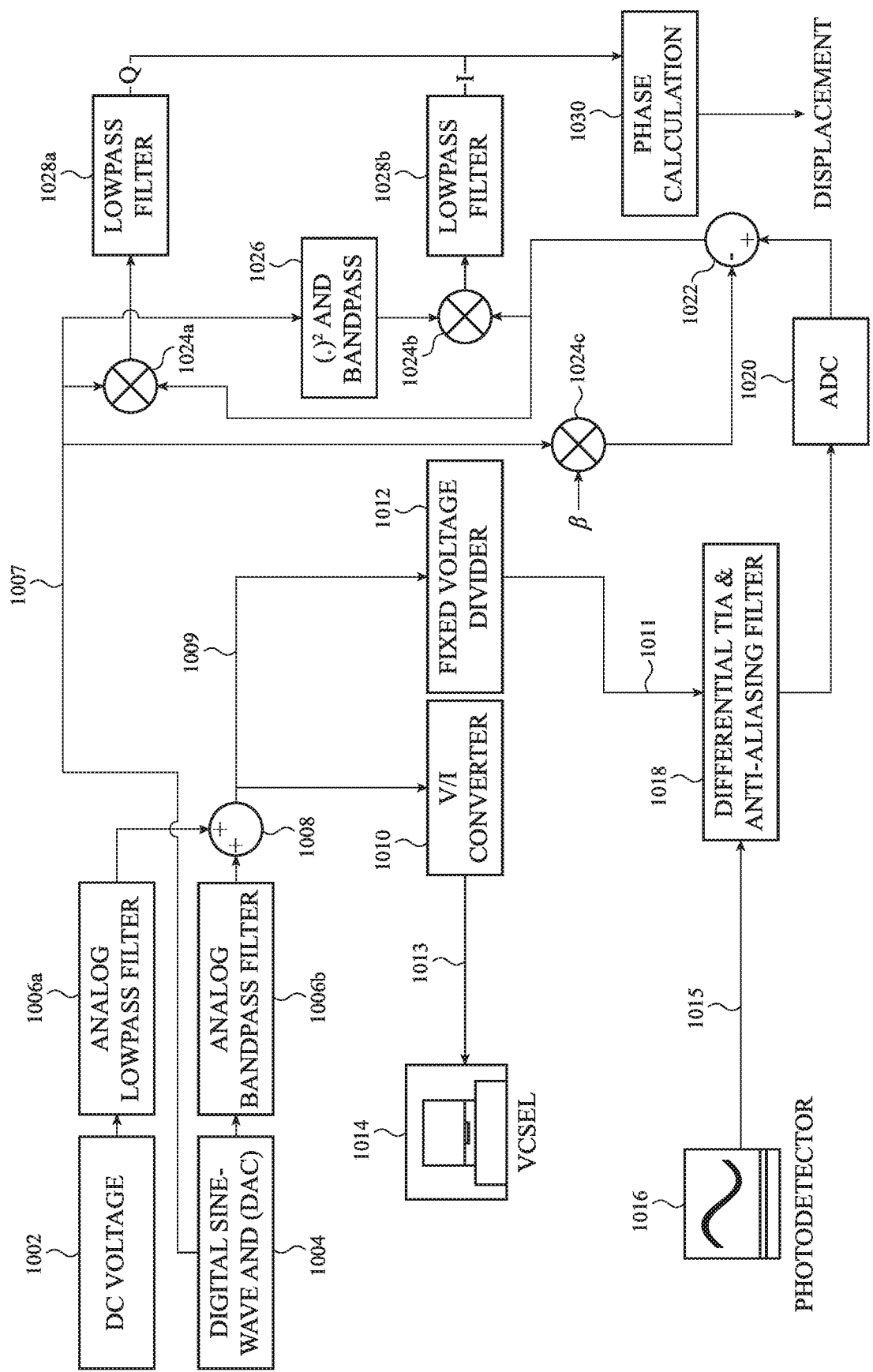
FIG. 10 shows an example circuit for the time determination of displacement of the target of FIG. 9.

Although FIGS. 1A-1B show mobile electronic devices, the techniques and structures described below can be used with touch screens or touch input surfaces of non-mobile devices, such as display screens of ATMs, ticket dispensers, and so on. Described below with respect to FIG. 10 are further components and systems that can be included in an electronic device that includes the embodiments described herein.

Figure 2A:
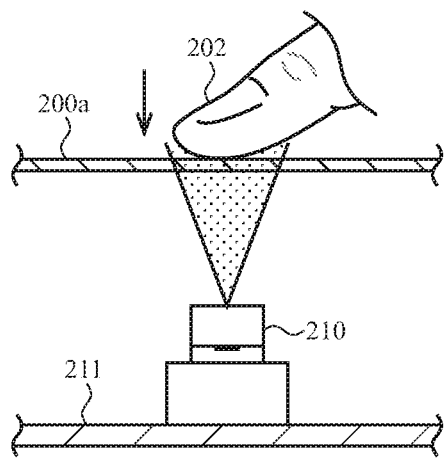
FIG. 2A illustrates a cross section of a transmissive touch input surface of an electronic device.
Figure 2B:
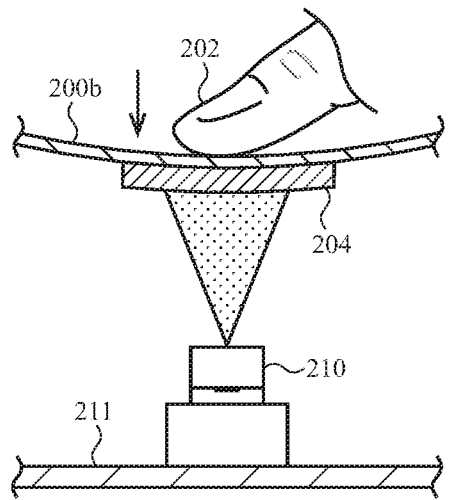
FIG. 2B illustrates a cross section of an electronic device with a reflective touch input surface capable of deflection.
Figure 2C:
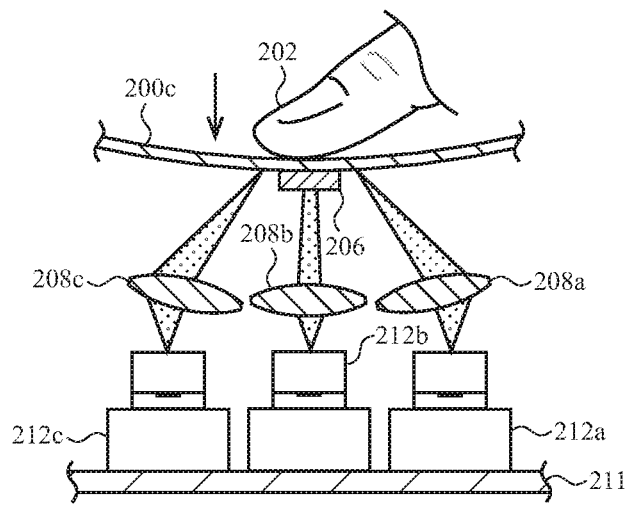
FIG. 2C illustrates a cross section of a mixed mode touch input surface capable of deflection.

FIGS. 2A-C show cross sections of various embodiments of touch input surfaces of electronic devices. For example, the cross sections may be along the cut lines A-A of the electronic device shown in FIG. 1A or along the cut lines B-B of the electronic device shown in FIG. 1B. These figures also show various respective configurations for lasers (e.g., VCSELs) that may be used within electronic devices to detect a user input on the touch input surface.

FIG. 2A shows a first embodiment in which a laser 210, supported on a substrate 211, within an electronic device, is configured to detect a user input on or near a touch input surface 200a. In this embodiment the touch input surface 200a is made from a light transmissive material, such as glass, that allows some or all incident light to pass through it. Coherent light (or just "light") from laser 210 is directed perpendicularly toward the touch input surface 200a and passes through it. When a user's finger 202 or other input device approaches the touch input surface 200a, a change may occur in the amount of light reflected back into the electronic device. The reflected light may be detected by internal receiving components, such as by one or more photodetectors. Additionally or alternatively, the reflected light may cause self-mixing interference within the laser 210 and so induce changes in interferometric parameters when the laser 210 is a VCSEL. The changes may be detectable by a photodetector associated with the VCSEL or by monitoring of electrical performance properties of the VCSEL (such as supply power, bias current, or junction voltage). The changes may be interpreted by a processing unit or combinations of processing components as a user input or type of user input. Some embodiments may also be able to detect an approach or proximity of the user's finger or input device.

FIG. 2B shows a second embodiment in which the laser 210, supported on a substrate 211, is configured to detect a user input on a touch input surface 200b that includes a reflective component 204. In this embodiment the touch input surface 200b is configured to deflect in response to a touch or force applied by the user. In some embodiments, the deflection of the touch input surface 200b may be on the order of 1 to 20 μm, though that is not required. When laser 210 emits its light toward the touch input surface 200b, the light reflects from the reflective component 204. When the touch input surface 200b has been deflected closer to the laser 210, there may be detected changes in interferometric parameters due to the laser's self-mixing interference. The detected changes can be interpreted as a user input or type of user input.

As described in more detail below, the detected changes may also enable the distance of the deflection to be determined. Also as described below, the detected changes may be analyzed to determine the speed and direction of the deflection on the touch input surface 200b.

FIG. 2C shows a third embodiment in which three lasers 212a, 212b, and 212c are supported on a substrate 211 and configured to emit coherent light towards touch input surface 200c that is both light transmissive (at least on some sections) and can be deflected by a force or applied pressure. The touch input surface 200c has a reflective surface 206 configured to reflect light from at least one of the three lasers 212a, 212b, and 212c. In the embodiment shown, only light emitted from the middle laser can be reflected back into the electronic device. As described for the configuration of FIG. 2B, the reflected light may be used to determine that a user input has occurred, and may be able to determine a speed and direction of a user's drag input.

In this embodiment, the light emitted from the two lasers 212a and 212c may be transmitted through the transmissive sections of the touch input surface 200c, and, as described above for the touch input surface 200a, may be used for detecting proximity of the user's finger or input device.

In the embodiment shown in FIG. 2C, the three lasers 212a, 212b, and 212c are provided with respective lenses 208a, 208b, and 208c. The lenses 208a, 208b, and 208c can serve to redirect light emitted from the respective lasers at a desired angle. In the case shown, light emitted from lasers 212a and 212b is redirected from the initial direction (horizontal to the left, as shown) to intersect or impinge on the touch input surface 200c at an acute angle (with respect to a vector normal to the touch input surface 200c).

Additionally and/or alternatively, in all configurations of FIGS. 2A-C, reflections of the emitted light of the laser(s) may be detected by one or more photodetectors. Changes in the reflected light (e.g., intensity, or reception location on the photodetector) may be detected and analyzed to determine whether the changes are due to a user input or particular type of user input. The photodetectors may be used as a secondary check for a user input detected by the laser(s), or instead of interferometric sensing performed at the laser. Certain embodiments using photodetectors will now be described.

Figure 2D:
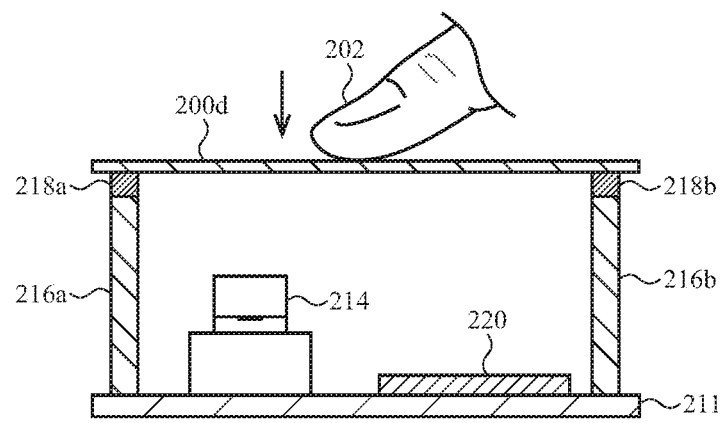
FIG. 2D illustrates a cross section of an electronic device having a rigid input surface atop compressible supports, and a laser system and a photodetector for detecting inputs, according to an embodiment.

FIG. 2D shows a fourth embodiment in which the user input surface 200d is rigid, and does not deflect detectably under pressure applied by a user's finger 202 or other input source. The embodiment includes a laser system in which a laser 214 and a photodetector 220 are supported on a substrate 211. The laser 214 emits its coherent light toward the user input surface 200d. The user input surface 200d is supported above the substrate by supports 216a, 216b. The supports 216a, 216b include respective compressible sections 218a, 218b. Upon application of pressure by a user's finger 202, or a stylus, the user input surface 200d retains its shape, but is displaced closer to the laser 214 by compression of the compressible sections 218a, 218b. This displacement can be detectable using self-mixing of the laser's coherent light reflected from the user input surface 200*d* and/or detection of the reflected light by the photodetector 220.

Figure 2E:
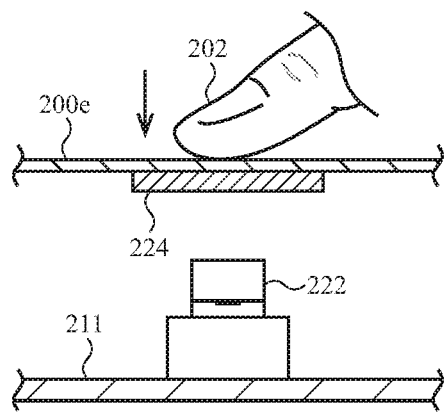
FIG. 2E illustrates a cross section of an electronic device with a laser system and a photodetector for detecting inputs on a touch input surface, according to an embodiment.

FIG. 2E shows a fifth embodiment, in which a laser system has a laser 222 that is supported on a substrate 211 within an electronic device, and is oriented to emit its coherent light toward deflectable user input surface 200*e*. In this configuration a photodetector 224 is affixed to an interior side of the user input surface 200*e*. Deflection or displacement of the user input surface 200*e* by a user's finger 202 can be detected using self-mixing of the coherent light from laser 222 reflected from the user input surface 200*e* and/or detection of the light by the photodetector 224.

Figure 2F:
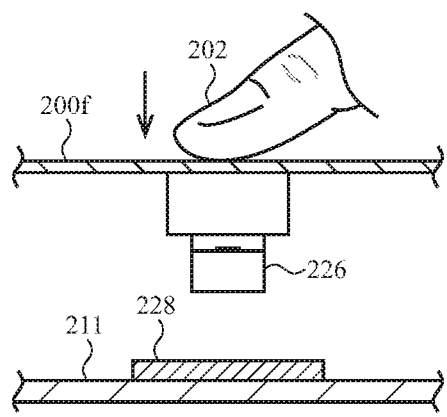
FIG. 2F illustrates a cross section of an electronic device with a laser system and a photodetector for detecting inputs on a touch input surface, according to another embodiment.

FIG. 2F shows a sixth embodiment analogous to that of FIG. 2E. In this embodiment of the laser system, a photodetector 228 is affixed to a substrate 211 within an electronic device. A laser 226 is affixed to an interior side of a user input surface 200*f*, and oriented to emit its coherent light toward the photodetector 228. Deflection or displacement of the user input surface 200*f* by input from a user's finger 202 can be detected using self-mixing of the coherent light from laser 222 reflected from the substrate and/or detection of the light by the photodetector 224.

The various configurations of lasers, photodetectors, and user input surfaces of FIGS. 2A-2F, as well as of other configurations, can be implemented to detect both very small static and dynamic displacements of the user input surfaces, as will now be explained in relation to FIGS. 3A-3C. In some embodiments, the displacements may be on the order of a few wavelengths of the laser light. Such capability may be used, for example, to implement a solid state button on a user input surface of an electronic device.

Figure 3A:
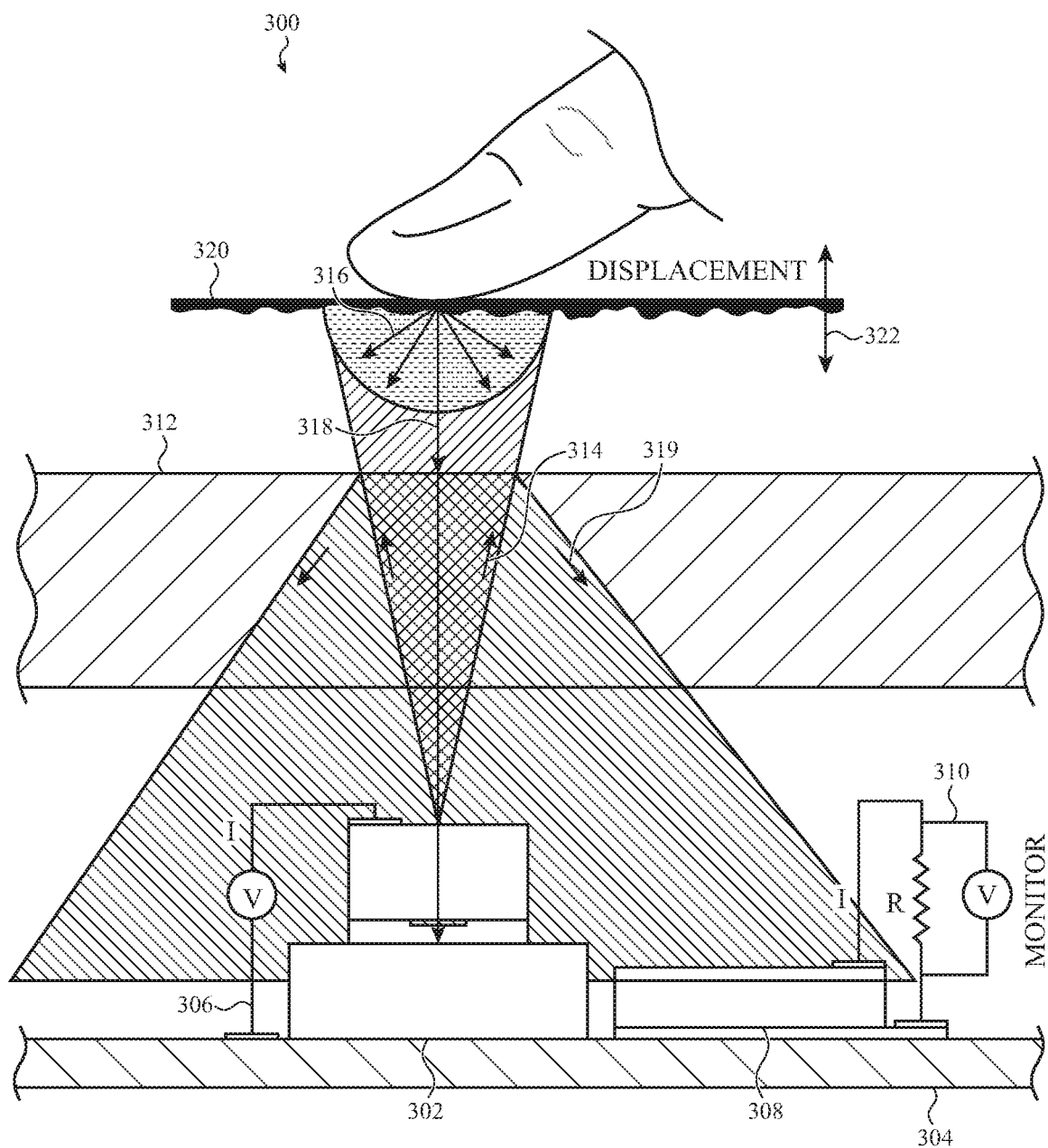
FIG. 3A illustrates part of a laser system that may use a VCSEL for detecting user input on a touch input surface, according to an embodiment.

FIG. 3A illustrates one embodiment of a laser system within an electronic device 300 that uses a laser 302 for detecting user input on a touch input surface 320. For simplification of explanation, the laser 302 will be assumed to be a VCSEL.

The VCSEL 302 may be mounted on a substrate 304 within the electronic device. Details of the VCSEL are explained below with respect to FIG. 4A. The VCSEL has connected to it associated circuitry 306 that supplies the VCSEL with a supply voltage and/or a signal voltage that causes the VCSEL 302 to lase, i.e., emit a beam of coherent light 314 (or just "emitted light"). In the embodiment shown, the emitted coherent light 314 is directed perpendicularly with respect to the substrate 304.

The emitted coherent light 314 travels from the VCSEL 302 through a cover glass 312 (or other member that is transparent to at least the wavelength of emitted coherent light 314 emitted by the laser). The cover glass 312 may serve to encapsulate the VCSEL 302 and associated electrical circuitry 306 within the electronic device 300. Above the cover glass 312 is a touch input surface 320 able to undergo a deflection or displacement 322 when a user presses it with sufficient force. The touch input surface 320 may in some embodiments be the top surface of the cover glass 312 itself, which deflects. Alternatively, there may be a gap between the cover glass 312 and the touch input surface 320, as shown. In still other embodiments in which the cover glass 312 is light transmissive, as in touch input surface 200*a*, the touch input surface 320 may instead be just a finger of a user.

When a signal is applied through the associated circuitry 306 to cause VCSEL 302 to lase, the emitted light 314 intersects the deflected touch input surface 320 and produces reflected light 316, which may be scattered in multiple directions. Some of the reflections 318 may be directed back towards VCSEL 302, enter its lasing cavity, and cause self-mixing interference. The self-mixing interference may produce detectable changes in interferometric parameters that may indicate a user input or particular type of user input.

Adjacent to the VCSEL 302 may be a photodetector 308 that is connected to monitoring circuitry 310. In the embodiment shown, the monitoring circuitry 310 is configured to monitor output current of the photodetector 308. Some of the reflected light 316 from the deflection of the touch input surface 320 may be reflected as light 319 that impinges on the photodetector 308. In this embodiment, the output current is produced as a photoelectric current resulting from light 319 impinging on the photodetector 308. In other embodiments, a photodetector (not shown) may be incorporated or integrated with the VCSEL 302.

Figure 3B:
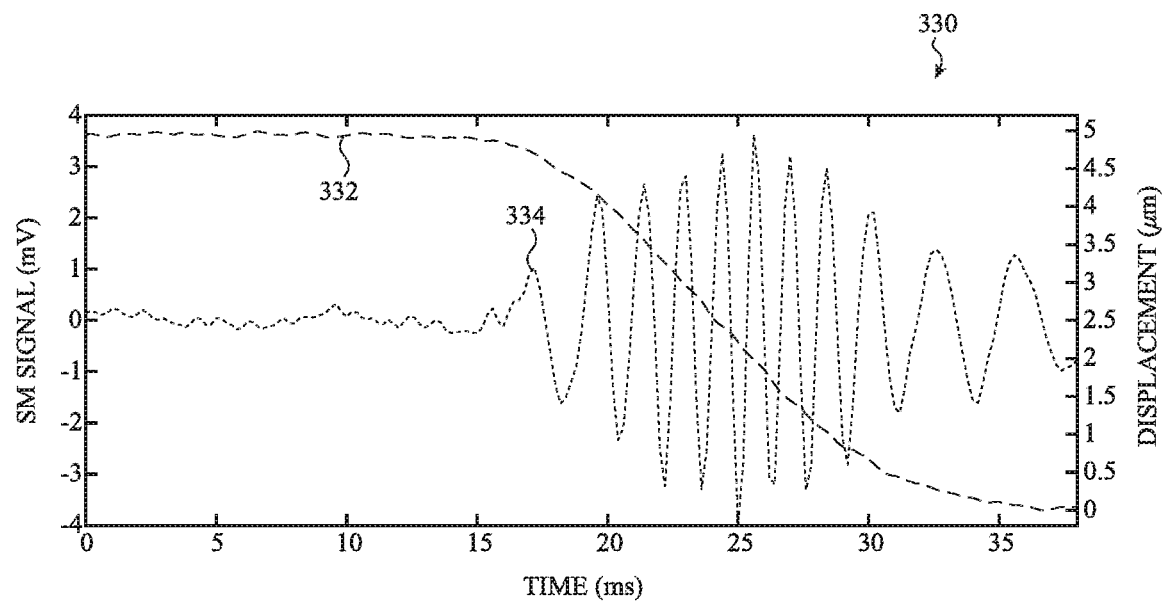
FIG. 3B illustrates a graph of an example photodetector signal due to a singular displacement of a touch input surface.

FIG. 3B is a graph 330 showing plots of an example output signal 334 of a measured interferometric parameter resulting from a static displacement 332 of a user input surface in a configuration similar to that of FIG. 3A. The displacement 332 is maintained at approximately 5 µm from times 0 to 15 msec, at which time the displacement begins to reduce. During the decrease in the displacement to zero, there are changes in a self-mixing of the laser light in the VCSEL producing a detectable oscillation in an interferometric parameter, as explained more fully in relation to FIGS. 4A-C. Additionally and/or alternatively, there can be detectable changes in an interferometric parameter detected by a photodetector used in conjunction with the VCSEL, such as photodetector 308. In the experimental results shown in FIG. 3B, the measured interferometric parameter is a voltage in the millivolt range. As shown, the changes in the static displacement 332 on the order of micrometers can produce a measurable output signal 334. As explained below, the velocity and direction of movement of the user input surface may be detected from the measured output signal 334 of an interferometric parameter.

Figure 3C:
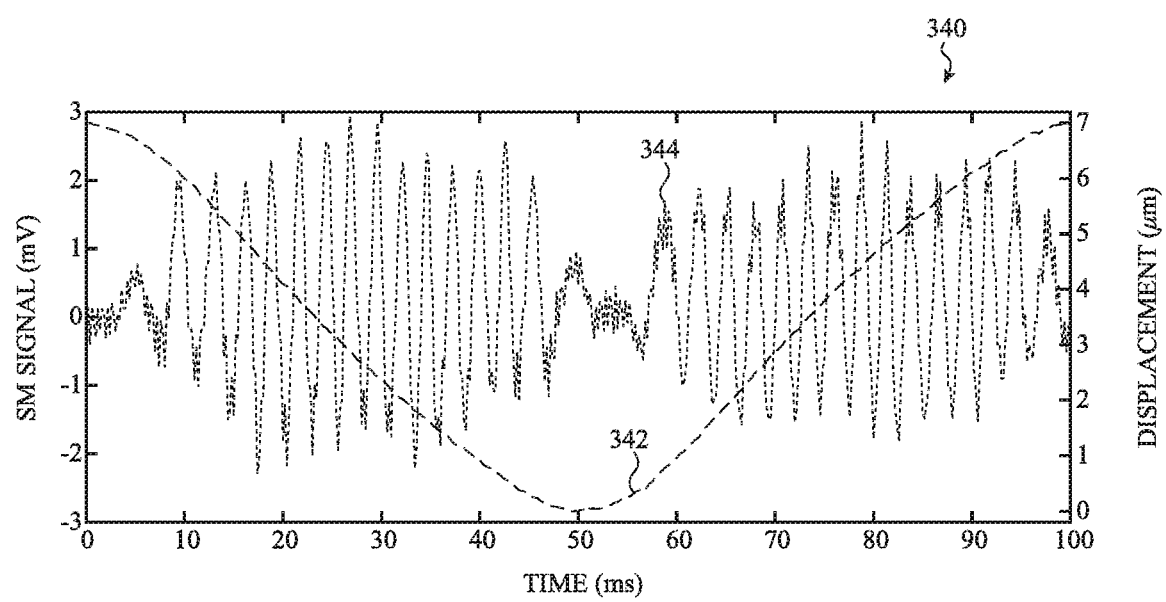
FIG. 3C illustrates a graph of an example photodetector signal due to a periodic displacement of a touch input surface.

FIG. 3C is a graph 340 showing plots of an example output signal 344 of a measured interferometric parameter resulting from a periodic displacement of a user input surface, such as the user input shown in FIG. 3A. The displacement 342 may be approximately a cosine wave with period of 100 msec. During the times when the displacement is changing most quickly, there may be greater changes in a self-mixing of the laser light in the VCSEL producing a detectable oscillation in an interferometric parameter. Additionally and/or alternatively, there can be detectable changes in an interferometric parameter detected by a photodetector used in conjunction with the VCSEL, such as photodetector 308. In the particular results shown in FIG. 3C, the measured interferometric parameter is a voltage in the millivolt range. As shown, the changes in the periodic displacement 342 (on the order of micrometers) can produce a measurable output signal 344. In other embodiments and/or configurations, the interferometric parameter may be another parameter, such as current or power. The graphs of such other interferometric parameters may differ from the displacement 342 shown in FIG. 3C. For example, the period of the waveform may differ, or the waveform may be other than one which approximates a cosine wave. As explained below, the velocity and direction of movement of the user input surface may be detected from the measured output signal 344 of an interferometric parameter.

Figure 4A:
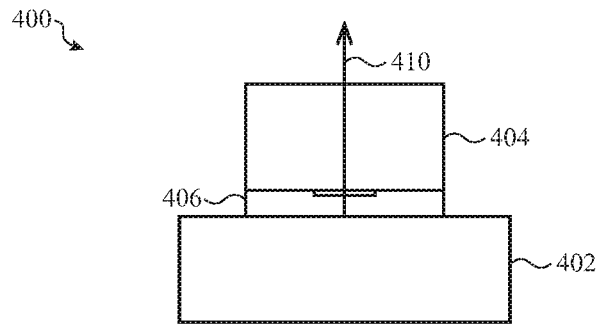
FIG. 4A illustrates a side view of a VCSEL, according to an embodiment.
Figure 4B:
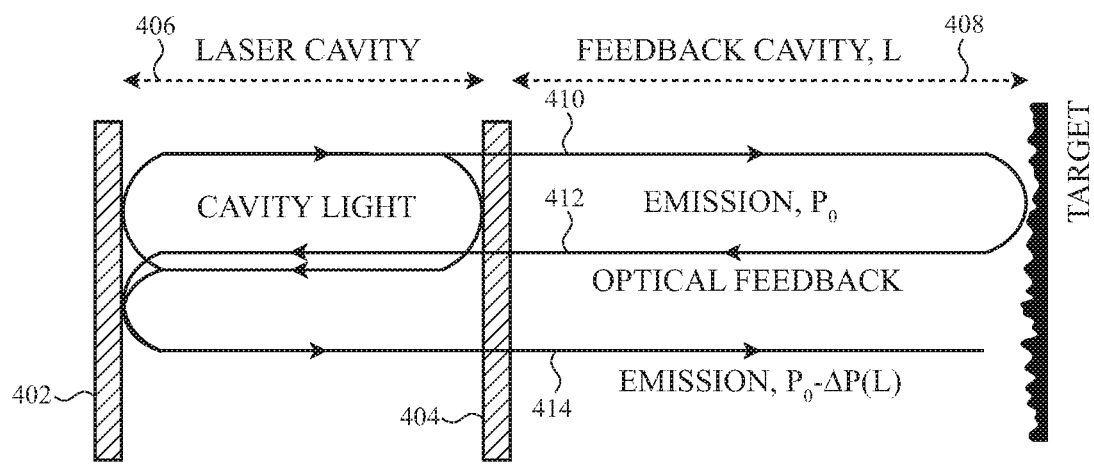
FIG. 4B illustrates self-mixing interference in a VCSEL.
Figure 4C:
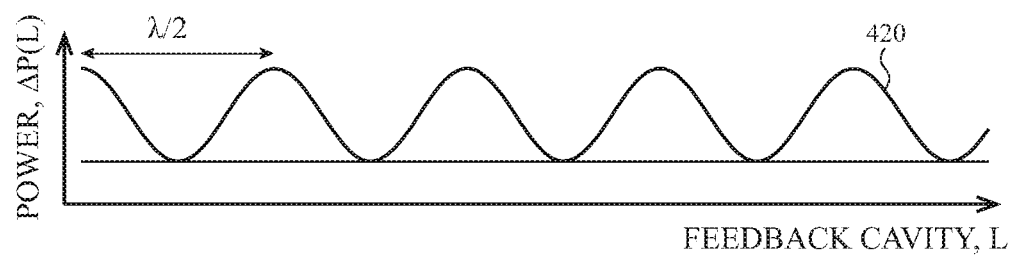
FIG. 4C shows a graph relating change in power in coherent light emitted by a VCSEL with length of a feedback cavity.

FIGS. 4A-C show examples of basic operations of a laser, such as a VCSEL. The operations may also be valid for other types of lasers that can undergo self-mixing interference.

FIG. 4A shows an example structural diagram of a VCSEL 400. In any type of laser, an input energy source causes a gain material within a cavity to emit light. Mirrors on ends of the cavity feed the light back into the gain material to cause amplification of the light and to cause the light to become coherent and (mostly) have a single wavelength. An aperture in one of the mirrors allows transmission of the laser light (e.g., transmission toward a touch input surface).

In the VCSEL 400, there are two mirrors 402 and 404 on opposite ends of the cavity. The lasing occurs within the cavity 406. In the VCSEL 400, the two mirrors 402 and 404 may be implemented as distributed Bragg reflectors, which are alternating layers with high and low refractive indices. The cavity 406 contains a gain material, which may include multiple doped layers of III-V semiconductors. In one example the gain material may include AlGaAs, InGaAs, and/or GaAs. The emitted laser light 410 can be emitted through the topmost layer or surface of VCSEL 400. In some VCSELs the coherent light is emitted through the bottom layer.

FIG. 4B shows a functional diagram of self-mixing interference (or also "optical feedback") with a laser. In FIG. 4B, the cavity 406 has been reoriented so that emitted laser light 410 is emitted from the cavity 406 to the right. The cavity 406 has a fixed length established at manufacture. The emitted laser light 410 travels away from the cavity 406 until it intersects or impinges on a target, which may be the touch input surface 320 of FIG. 3. The gap of distance L from the emission point through the mirror 404 of the emitted laser light 410 to the target is termed the feedback cavity 408. The length L of the feedback cavity 408 is variable as the target can move with respect to the VCSEL 400.

The emitted laser light 410 is reflected back into the cavity 406 by the target. The reflected light 412 enters the cavity 406 to interact with the original emitted laser light 410. This results in a combined emitted laser light 414. The combined emitted laser light 414 may have characteristics (e.g., a wavelength or power) that differ from what the emitted laser light 410 would have in the absence of reflection and self-mixing interference.

FIG. 4C is a graph 420 showing the variation in power of the combined emitted laser light 414 as a function of the length L of the feedback cavity 408, i.e., the distance from the emission point through the mirror 404 of the emitted laser light 410 to the target. The graph depicts a predominantly sinusoidal variation with a period of $\lambda/2$. Theoretical considerations imply that the variation is given by the proportionality relationship: $\Delta P \propto \cos(4\pi L/\lambda)$. This relationship generally holds in the absence of a strong specular reflection. In the case of such strong specular reflection, the cosine becomes distorted, i.e., higher harmonics are present in the relationship. However, the peak-to-peak separation stays at $\lambda/2$. For a stationary target, this relationship can be used to determine that a deflection has occurred. In conjunction with other techniques, such as counting of the completed number of periods, the absolute distance of the deflection may also be determined. The case of a non-stationary target, such as during a drag operation of a user press, is explained below in relation to FIGS. 7A-B.

Figure 4D:
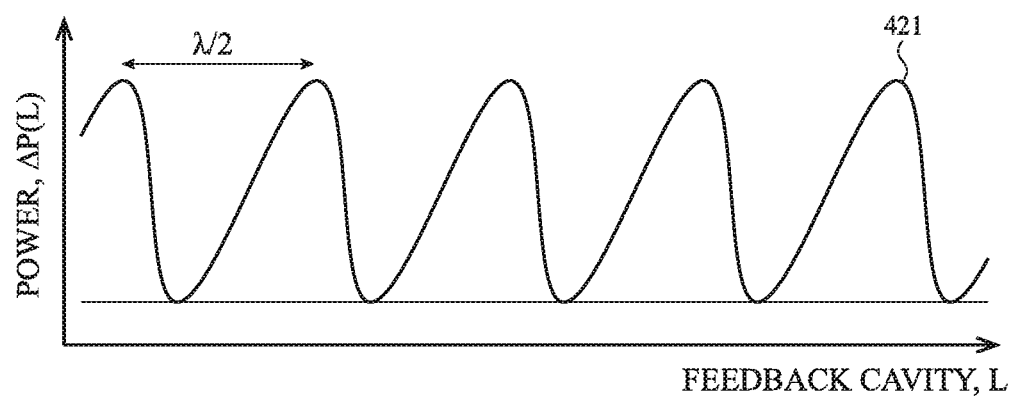
FIG. 4D shows a graph relating change in power in coherent light emitted by a VCSEL with length of a feedback cavity, in the case that the target is moving.

FIG. 4D shows a graph 421 of the variation in power of the combined emitted laser light 414 as a function of the length L of the feedback cavity 408, in the case of strong specular reflection. In this case the curve is a distorted cosine. The period of the curve is still approximately $\lambda/2$.

FIGS. 5A-D show cross sections of respective configurations 500a-d for laser systems within an electronic device for detecting user input on a user input surface, according to various embodiments. Hereinafter, for simplicity of explanation, such laser systems will be presumed to use VCSELs as the laser light source. It will be clear to one of skill in the art how to implement the embodiments using other laser light sources. In the embodiments shown, a user input surface 506 of the electronic device experiences a user touch input. The user input surface 506 may be a cover glass. The user input surface 506 may deflect when pressed. Or, as illustrated in FIG. 2D, the user input surface may be rigid but may be displaced. The deflection may occur only at or near a top edge, or the entire user input surface 506 may deflect. The thickness of the user input surface 506 may be chosen for ease of detection of an applied user input. Additionally and/or alternatively, the user input surface 506 may allow transmission of light, either entirely or in part.

Various embodiments may detect not just a press (force or pressure) from a user at a specific location on the user input surface 506, but also may be able to track a movement of the user's finger (or stylus) across the user input surface 506.

In these embodiments, the VCSELs and other components for detecting the deflection of the outer surface of user input surface 506 may be contained in a module 504. In these embodiments the module 504 may include an aperture that contains a respective lens to redirect the emitted laser light 508 of the various VCSELs. The redirection of the emitted laser light 508 can be used to detect motion of the user input, as explained below in relation to FIGS. 7A-B.

Figure 5A:
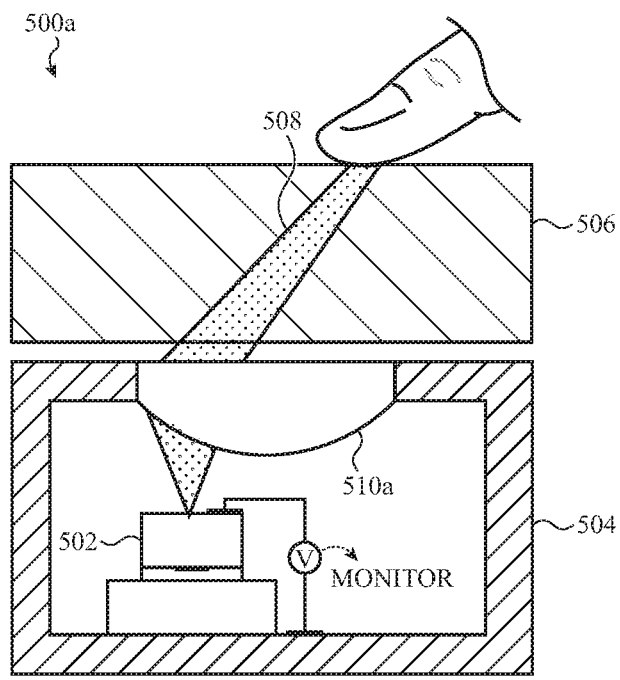
FIG. 5A illustrates a side view of a configuration of part of a laser system for detecting user input, according to an embodiment.

In the embodiment 500a of FIG. 5A, a single VCSEL 502 is connected to one side of the module 504. The VCSEL 502 is connected to the module 504 so that the emitted laser light 508 is directed toward lens 510a mounted in an aperture on another side of module 504. The lens 510a redirects emitted laser light 508 to intersect the user input surface 506 at an acute angle with respect to a vector normal (i.e., perpendicular) to the user input surface 506 at the point of the user input. Reflections from a deflection or displacement may be received back into VCSEL 502 and induce self-mixing interference in VCSEL 502. The self-mixing interference may produce detectable changes in interferometric parameters to allow for user input detection.

Figure 5B:
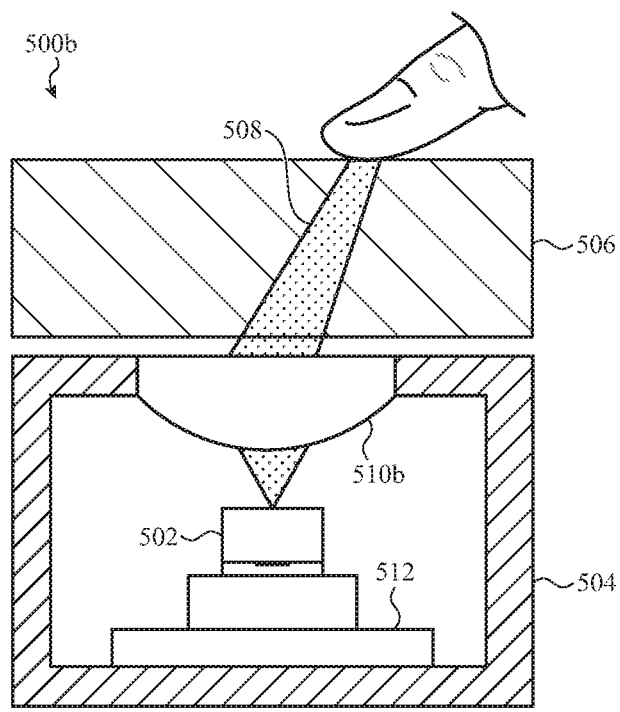
FIG. 5B illustrates a side view of a configuration of part of a laser system for detecting user input, according to an embodiment.

In the embodiment 500b of FIG. 5B, a single VCSEL 502 is connected above a photodetector 512 that is connected to one side of the module 504. As with the embodiment of FIG. 5A, VCSEL 502 is connected to the module 504 so that the emitted laser light 508 is directed toward lens 510b mounted in an aperture on another side of module 504. The lens 510b redirects emitted laser light 508 to intersect the user input surface 506 at an acute angle with respect to a vector normal to the user input surface 506 at the point of the user input. Reflections from a deflection may be received back into VCSEL 502 and induce self-mixing interference in VCSEL 502. The self-mixing interference may produce detectable changes in interferometric parameters to allow for user input detection.

Additionally and/or alternatively, the reflected light may also be detected by the photodetector 512. Changes in photodetector 512 performance due to received reflected light may also be used determine if a user is applying a force to the user input surface 506.

Figure 5C:
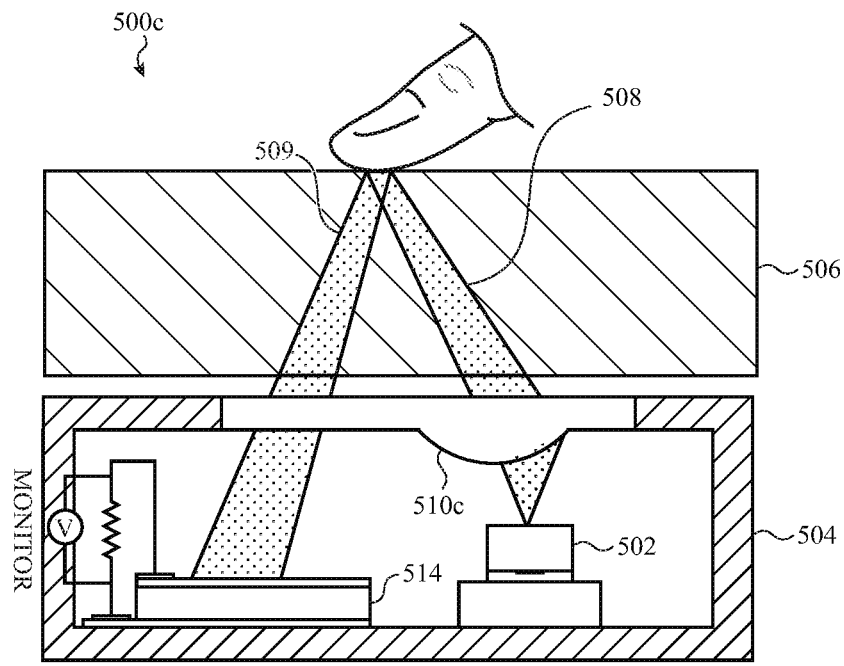
FIG. 5C illustrates a side view of a configuration of part of a laser system for detecting user input, according to an embodiment.

In the embodiment 500c of FIG. 5C, a single VCSEL 502 is connected to one side of the module 504. As with the embodiment of FIG. 5A, VCSEL 502 is connected to the module 504 so that the emitted laser light 508 is directed toward lens 510c mounted in an aperture on another side of module 504. The lens 510c redirects emitted laser light 508 to intersect the user input surface 506 at an acute angle with respect to a vector normal to the user input surface 506 at the point of the user input. Some reflections from deflection may induce self-mixing interference in VCSEL 502. The self-mixing interference may produce detectable changes in interferometric parameters to allow for user input detection.

In this embodiment, there may be an additional photodetector 514 connected to the module 504. The photodetector 514 may be positioned adjacent to the VCSEL 502. In this embodiment, differently reflected light 509 travels from deflections at the point of user input to be received by the photodetector 514. Changes in photodetector 514 performance due to received reflected light may also be used to determine if a user is applying a force to the user input surface 506.

Figure 5D:
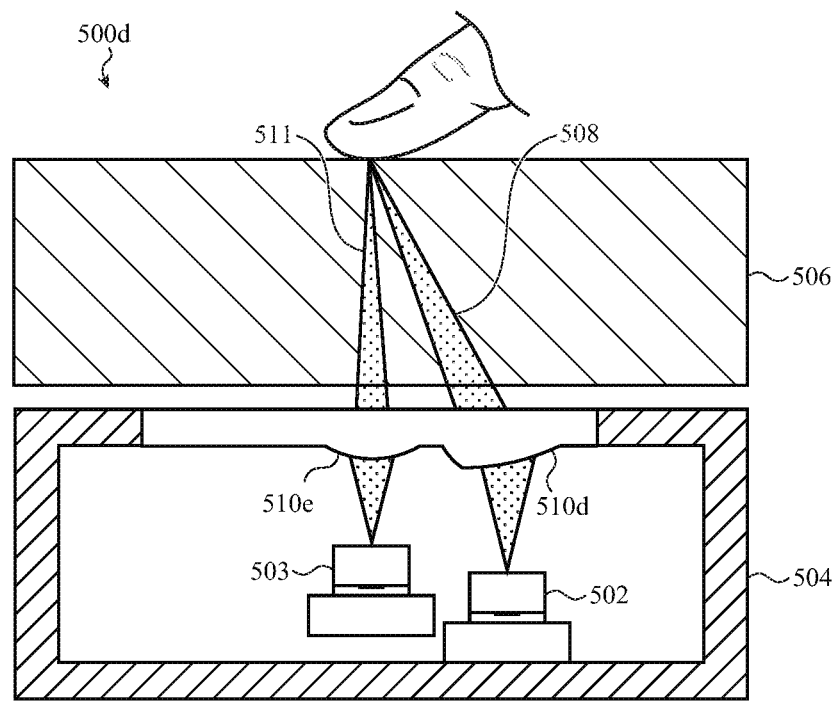
FIG. 5D illustrates a side view of a configuration of part of a laser system for detecting user input, according to an embodiment.

In the embodiment 500d of FIG. 5D, two VCSELs 502 and 503 are positioned within the module 504. The embodiment shown in FIG. 5D may be part of further embodiments that use two or more VCSELs, such as those discussed below with respect to FIGS. 6A-B. In the embodiment of FIG. 5D, the VCSEL 502 is connected to the module 504 so that the emitted laser light 508 is directed through the lens 510d mounted in an aperture on a side of the module 504. The VCSEL 503 is connected to the module 504 so that its respective emitted laser light 511 is directed through lens 510e mounted in the aperture of module 504.

In the embodiment 500d of FIG. 5D, the lens 510d redirects emitted laser light 508 to intersect the user input surface 506 at an acute angle with respect to a vector normal to the user input surface 506 at the point of the user input. Reflections from a deflection may be received back into VCSEL 502 and induce self-mixing interference in VCSEL 502. The emitted laser light 511 may be directed to intersect the user input surface 506 perpendicularly, so that the reflections of the light are relatively more likely to be received back into VCSEL 503 and induce self-mixing interference in VCSEL 503. The VCSELs 502 and 503 may have the emissions of their laser light time multiplexed (i.e., alternate in time) by a separate controller (not shown). Such time multiplexing can reduce crosstalk interference. A specific case of time multiplexing is shown below in FIG. 6C, in relation to the configuration of FIG. 6A.

The self-mixing interferences within VCSELs 502 and 503 may produce detectable changes in their respective interferometric parameters. These respective changes may be used together to aid in detection of both a user input and a direction of movement of such a user input. Such multiple VCSEL detection will now be discussed.

Figure 6A:
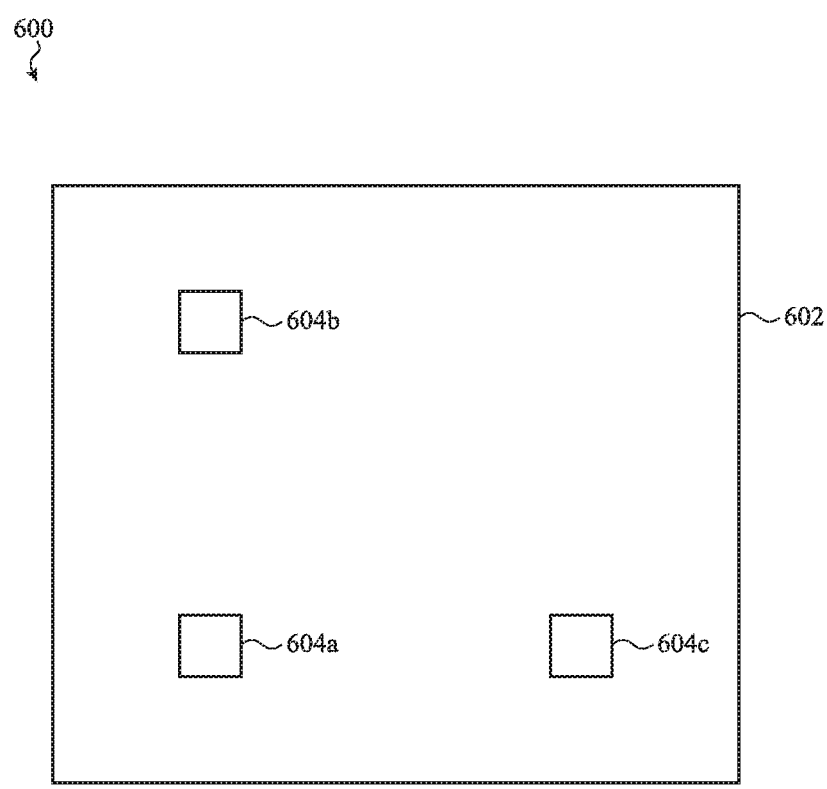
FIG. 6A illustrates a plan view of lasers in a laser system for detecting user input, according to an embodiment.

FIG. 6A shows a plan view of an arrangement 600 of three VCSELs 604a, 604b, and 604c positioned on a substrate 602 within an electronic device. The configuration is directed to detecting motion or movement of a user's touch or press on a touch input surface. The VCSEL 604a is positioned so that it is located at an intersection of an imaginary line connecting VCSEL 604a to VCSEL 604b and an imaginary line connecting VCSEL 604a to VCSEL 604c. In the embodiment shown, the two lines form a right angle, but in other embodiments the lines may intersect at a different angle. The distance from VCSEL 604a to VCSEL 604b may be the same as, or different from, the distance from VCSEL 604a to VCSEL 604c. Using three (or more) VCSELs arranged non-collinearly may allow for detection of lateral movement of a user input (such as in a drag motion) in separate directions along a user input surface, as will now be explained.

Figure 6B:
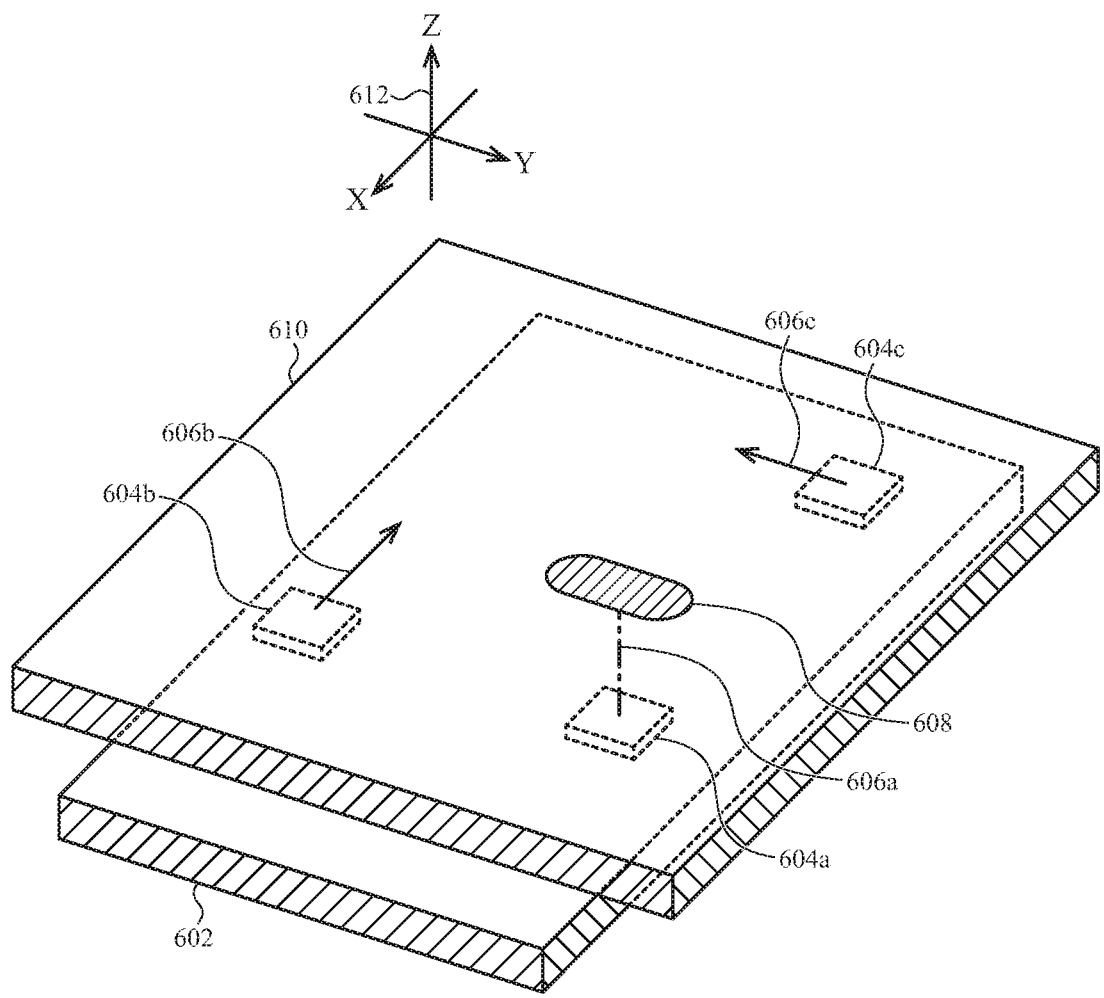
FIG. 6B shows a perspective view of lasers in a laser system for detecting user input, according to an embodiment.

FIG. 6B shows a perspective view of components of an electronic device for detecting the existence and movement of a user input on a touch input surface. Shown in FIG. 6B is a substrate 602 positioned beneath a touch input surface 610. In the embodiment shown, the substrate 602 and touch input surface 610 are configured as parallel planes. Three VCSELs 604a, 604b, and 604c, are connected to substrate 602 and positioned as shown in FIG. 6A. The three VCSELs 604a, 604b, and 604c are positioned to emit respective laser lights (which are coherent light beams) 606a, 606b, and 606c toward the touch input surface 610. Lenses may be associated with one or more of the VCSELs 604a, 604b, and 604c to redirect the laser light beams.

In the embodiment shown, VCSEL 604a emits laser light 606a perpendicularly toward the touch input surface 610. Positioned above VCSEL 604a is a reflector 608, so that the emitted laser light 606a is likely to be reflected back into VCSEL 604a and induce self-mixing interference. Other embodiments may omit the reflector 608. The reflective material of reflector 608 may be positioned on either the inner side (toward VCSEL 604a) or the outer side of touch input surface 610. In this embodiment, the VCSEL 604b emits laser light 606b that may be deflected by a lens (not shown) to intersect the touch input surface 610 at a first acute angle. The VCSEL 604c emits laser light 606c that is deflected by a second lens (not shown) to intersect the touch input surface 610 at a second acute angle.

VCSEL 604a can be used for detection of a user input (e.g., a press) on the touch input surface 610. Due to the reflector 608, the likelihood that reflected light from the emitted laser light 606a is received back into VCSEL 604a may be increased. Thus, when a user input causes a deflection of the touch input surface 610, the likelihood of detectable changes in the interferometric parameters corresponding to VCSEL 604a may also be increased. In some embodiments, interferometric parameters of VCSEL 604a may be given more importance for detection of a user input.

The two VCSELs 604b and 604c may be used for detection of motion or movement of a user input, as well as for an initial determination that there is a user input. The virtual axes 612 provide an orientation. The Z-axis is oriented perpendicularly into the touch input surface 610. As explained below with respect to FIGS. 7A-B, speed and direction of motion of a target (e.g., a deflection) toward or away from a VCSEL may also be detectable.

In the embodiment shown, the emitted laser light 606b is directed from the VCSEL 604b both vertically in the Z-axis and along the Y-direction. A lateral movement of a deflection across the touch input surface 610 having a component in the Y-direction may be detectable using an analysis of the interferometric parameters corresponding to VCSEL 604b. Analogously, the emitted laser light 606c is directed from the VCSEL 604c both vertically in the Z-axis and along the X-direction. A lateral movement of the deflection across the touch input surface 610 having a component in the X-direction may be detectable using a separate analysis of the interferometric parameters corresponding to VCSEL 604c.

Figure 6C:
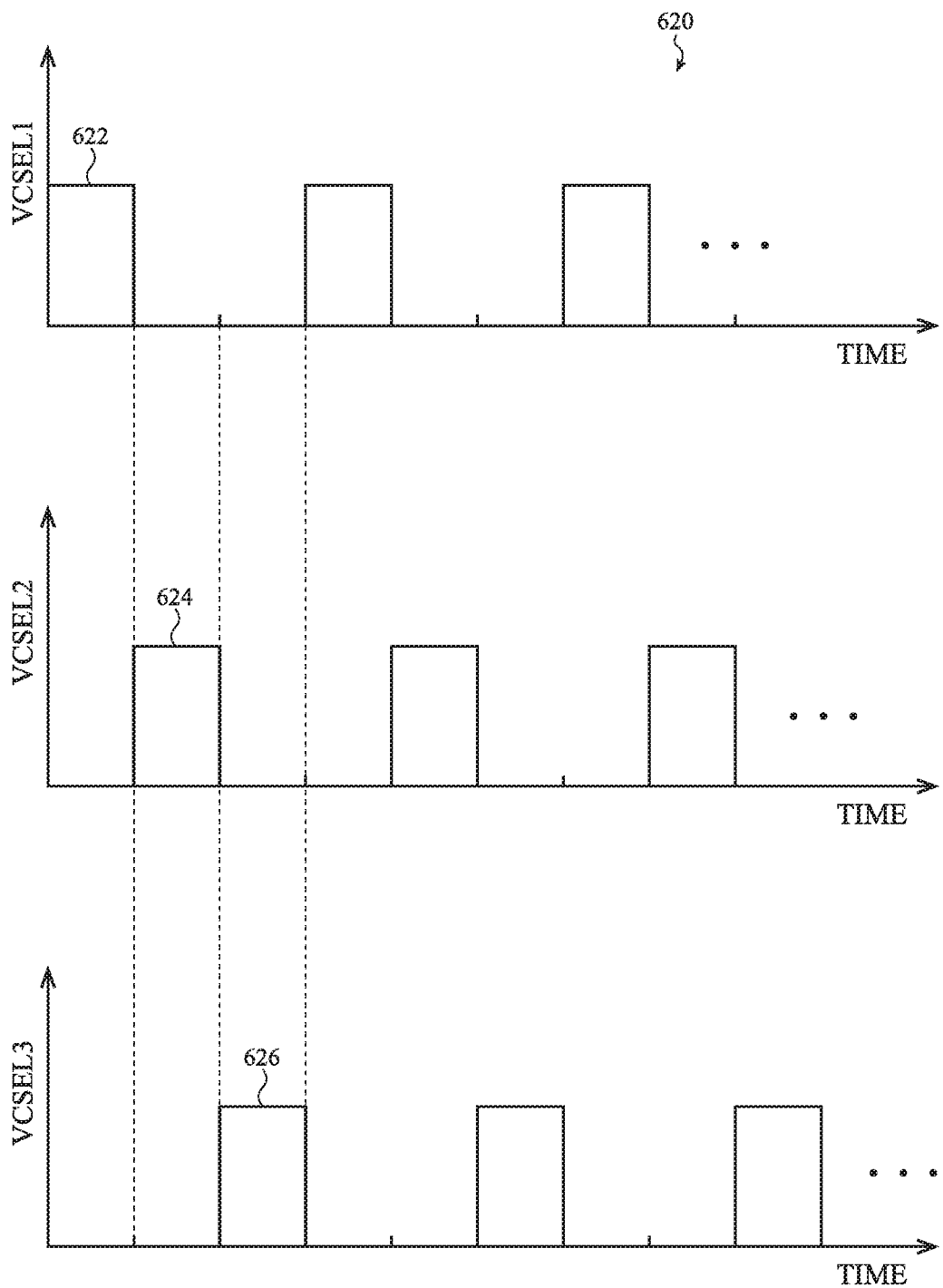
FIG. 6C shows time correlated graphs of time-multiplexed signals to lasers, according to an embodiment.

FIG. 6C shows time correlated graphs of time multiplexed driving inputs 622, 624, and 626 applied to VCSELs 604a, 604b, and 604c. By time multiplexing their laser light emissions, signals caused by self-mixing interference, or from detection by a photodetector, only arise from one VCSEL source in each time interval. In some embodiments, a small buffer interval of time (not shown) may separate driving inputs 622 and 624, and driving inputs 624 and 626. Methods and procedures for detecting user inputs and motion of such inputs on a user input surface will now be explained.

Interferometric parameters, or changes in them, induced by self-mixing interference may be used to a determine distance between a laser light source, such as a VCSEL, and the target or reflecting object. The determined distance may be either a change in distance from a known reference distance, or may be an absolute distance. Also, interferometric parameters, or changes in them, induced by self-mixing interference may be used to a determine a velocity of the target or reflecting object. This disclosure now presents three families of embodiments for determining distance and/or velocity using measurements of interferometric parameters. A first family of embodiments is described in relation to FIGS. 7A-7B. This family may use a modulation of a bias current to a laser diode to modulate the wavelength emitted by the laser diode. An absolute distance to, or velocity of, the target may be obtained by performing a spectrum analysis of samples of an interferometric parameter. A second family of embodiments, described in relation to FIGS. 8A-8C, uses a time domain analysis without sampling of a measured interferometric parameter. A third family of embodiments, described in relation to FIGS. 9A-9B, is based on modulating a bias current of a VCSEL and measuring spectral properties (harmonics) of a signal of a photodetector associated with VCSEL.

Figure 7A:
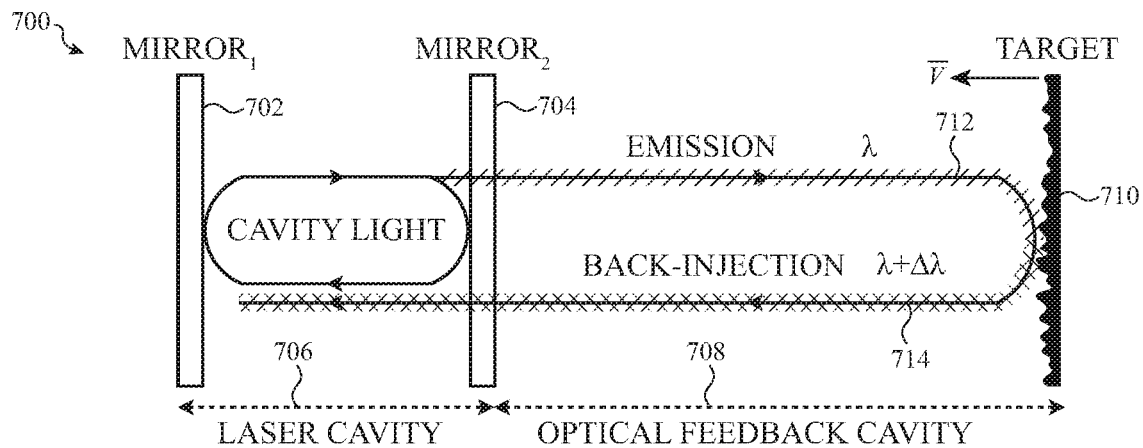
FIG. 7A illustrates self-mixing or interferometric feedback in a VCSEL that emits coherent light toward, and receives reflected coherent light from, a target that is moving.
Figure 7A:
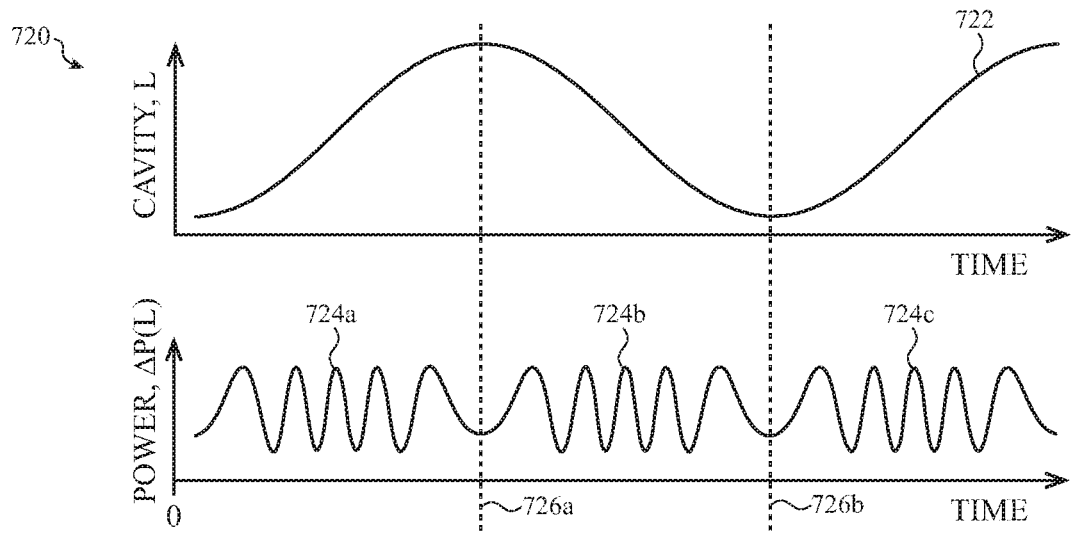
Figure 7A:
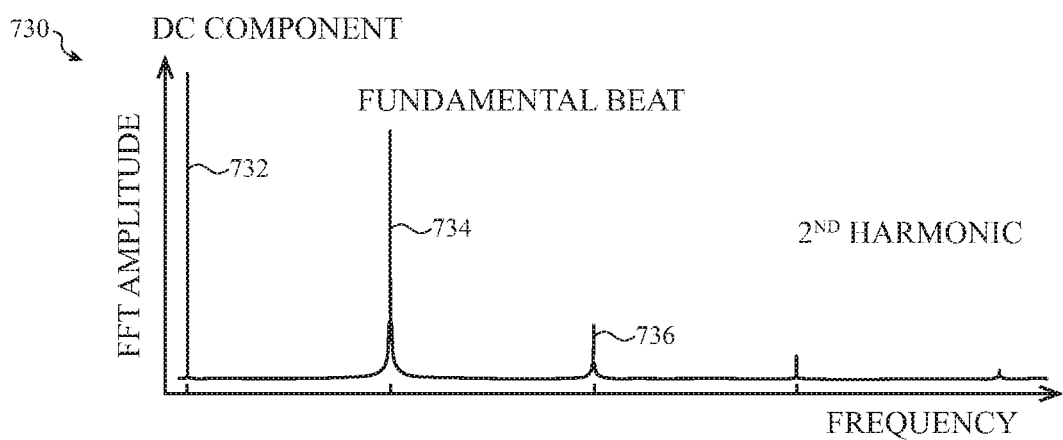

FIG. 7A shows a diagram 700 of components of a laser capable of self-mixing interference that can produce changes in interferometric parameters. As in such lasers, there are two mirrors 702 and 704 enclosing the lasing material within the laser cavity 706. In VCSELs, the mirrors may be implemented as distributed Bragg reflectors. In the absence of a target 710 to produce reflection, the emitted laser light 712 would have a wavelength $\lambda$.

In the embodiment shown, there is a target 710 moving with respect to the laser with a speed (magnitude) $\bar{v}$. The velocity of the movement may be either toward or away from the laser. The target 710 produces a reflected light 714 that, due to Doppler effects of the movement, has an altered wavelength $\lambda+\Delta\lambda$. The Doppler induced change in wavelength is given by $\Delta\lambda=\bar{v}\times(2\pi/c)$. The reflected light 714 induces self-mixing interference in the laser, which can produce changes in interferometric parameters associated with the laser light. These changed interferometric parameters can include changes in junction voltage or current, a laser bias current, voltage or supply power, another interferometric parameter, or, for embodiment using a photodetector, a change in an output current, voltage, or power of the photodetector.

Using the particular example of power, and recalling from above that in the absence of a strong back reflection (e.g., no specular reflector), the change in power is related to the length L of the optical feedback cavity 708 by $\Delta P \propto \cos(4n\pi/\lambda)$, one sees that movement of the target 710 causes the length L of the optical feedback cavity 708 to change through multiple wavelengths of the emitted laser light 712. The sinusoidal movement of the target 710 is shown in the plot 722 in the top of correlated graphs 720. The movement causes the change in power to have the primarily sinusoidal plots 724a-c shown in the lower of the correlated graphs 720. The motion of the target reverses direction at times 726a and 726b. In the case of strong back reflection, as discussed previously in relation to FIG. 4D, the functional form for the change in power has further harmonics and has a distorted cosine shape. The sinusoidal plots 724a-c would then be altered accordingly.

Because the movement of the target causes the optical feedback cavity length to change through multiple wavelengths of the emitted laser light, the sinusoidal power signal (or an equivalent sinusoidal signal of another interferometric parameter) is amenable for spectrum analysis, such as with a Fast Fourier Transform (FFT). Embodiments based on such spectrum analyses provide a first family of embodiments of methods and devices for using self-mixing interference for measuring distance and velocity of a target. The bottom graph 730 of FIG. 7A shows an amplitude (or "magnitude") plot from such a spectrum analysis. The spectrum may have been calculated from samples taken within a sampling time interval contained between time 0 and time 726a, during which the target is moving in a single direction with respect to the laser.

In some embodiments, the spectrum analysis may use a sample size of 128 or 256 samples. The spectrum analysis may also apply a filter (such as a triangle filter, a raised cosine filter, or the like) to the samples of the signal of the interferometric parameter being measured (such as the supply power or change therein, or the junction voltage or current, or the laser bias current, among others).

FIG. 7A shows a graph 730 of the magnitude or amplitude spectrum in which there are three pronounced components. There is a DC component 732, which reflects the fact that the signal of the interferometric parameter often has a steady state value around which the signal oscillates sinusoidally. There is then a first harmonic frequency, or fundamental beat 734, that is associated with the major or predominant frequency $f_B$ of the sinusoidal signal of the interferometric parameter. It can be shown that in some configurations $f_B=c\times(\Delta\lambda/\lambda^2)$, where $\Delta\lambda$ is the Doppler shift in the wavelength due target motion, and is given by $\Delta\lambda=\bar{v}\times(2\lambda/c)$. In the case of sufficient back reflection into the laser cavity, the signal is rarely a pure sinusoid, so the magnitude spectrum may also show a second harmonic frequency component at frequency $2\times f_B$, and a third harmonic frequency component at frequency $3\times f_B$. Higher harmonic frequency components may exist but are typically reduced. The measured fundamental beat frequency $f_B$ can be used to calculate $\Delta\lambda$, from which $\bar{v}$ can be calculated. Examples of values relating the speed of the target to $\Delta\lambda$ and $f_B$ are given in Table 1, for a laser having unmixed emitted light with a wavelength of 940 nm, under a specific environment, refractive index and beam angle:

TABLE 1

| Speed $\bar{v}$ | $\Delta\lambda$ | $f_B$ |
| --- | --- | --- |
| 1 mm/s | $6.3 \times 10^{-9}$ nm | 2.13 kHz |
| 10 mm/s | $6.3 \times 10^{-8}$ nm | 21.3 kHz |
| 100 mm/s | $6.3 \times 10^{-7}$ nm | 213 kHz |

Figure 7B:
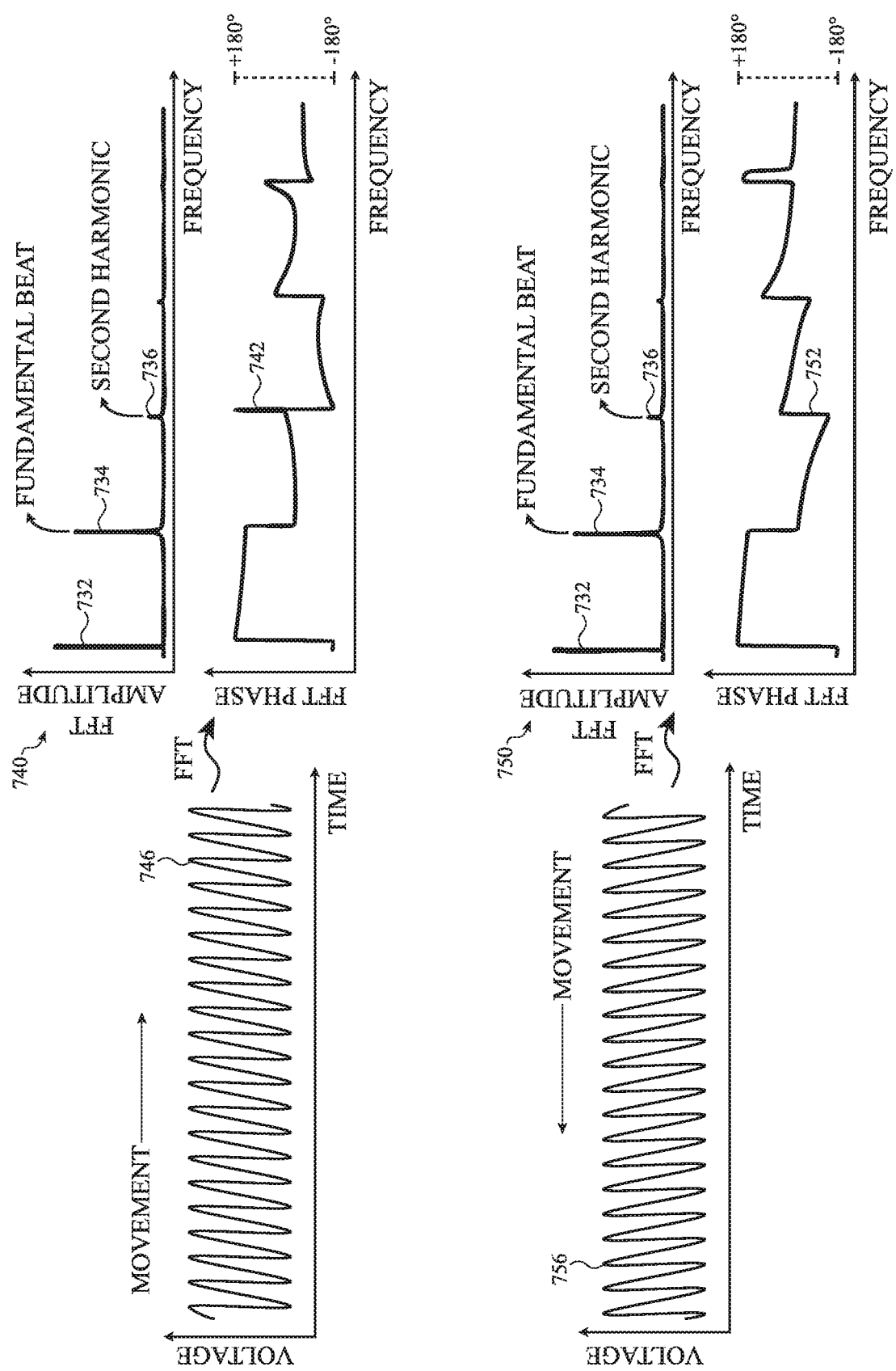
FIG. 7B shows graphs from spectrum analyses of interferometric parameters of a VCSEL that are measured for moving targets.

FIG. 7B shows a first combined magnitude and phase graph 740 obtained from, in one embodiment, a spectrum analysis of a junction voltage signal. The top of the combined magnitude and phase graph 740 shows the magnitude of the FFT, while the bottom of phase graph 740 shows the phase. In the phase graph 740, the target is moving in a first direction with respect to the laser. The movement of the target produces a predominantly but non-ideal sinusoidal form, so that there is more than one harmonic present, as shown in amplitude plot in the top of the combined magnitude and phase graph 740. FIG. 7B also shows a second combined magnitude and phase graph 750 obtained under the same conditions except that the target is moving in the opposite direction (at the same speed).

A phase shift at the second harmonic frequency may be used to determine a direction of the motion. The specific example shown in the phase plot of phase graph 740 is from a spectrum analysis performed on a voltage signal induced by the target moving in a first direction with respect to the laser. The direction is obtained by calculating:

2×phase{Fundamental Harmonic}−phase{Second Harmonic}.

When this value is greater than zero, the target is moving toward the laser, whereas when the value is less than zero, the target is moving away from the laser. Next, the specific example shown in the phase plot of graph 750 is from an example spectrum analysis performed on a voltage signal induced by the target moving in the opposite of the first direction with respect to the laser. The calculation of the above quantity in this case will be less than zero.

To return to the configuration and embodiments described in FIG. 6B, a drag motion laterally across the touch input surface 610 induces a deflection inwards (i.e., in the Z-direction) that moves similarly in or on the touch input surface 610. The movement of the deflection has a component along each of the X- and Y-directions. These component motions may be separately detected based on spectrum analyses of changes in interferometric parameters of at least the VCSELs 604b and 604c. These detections are aided by the deflections of the emitted laser lights 606b and 606c. Further details about the lenses that may be used to cause such deflections are given now.

Figure 7C:
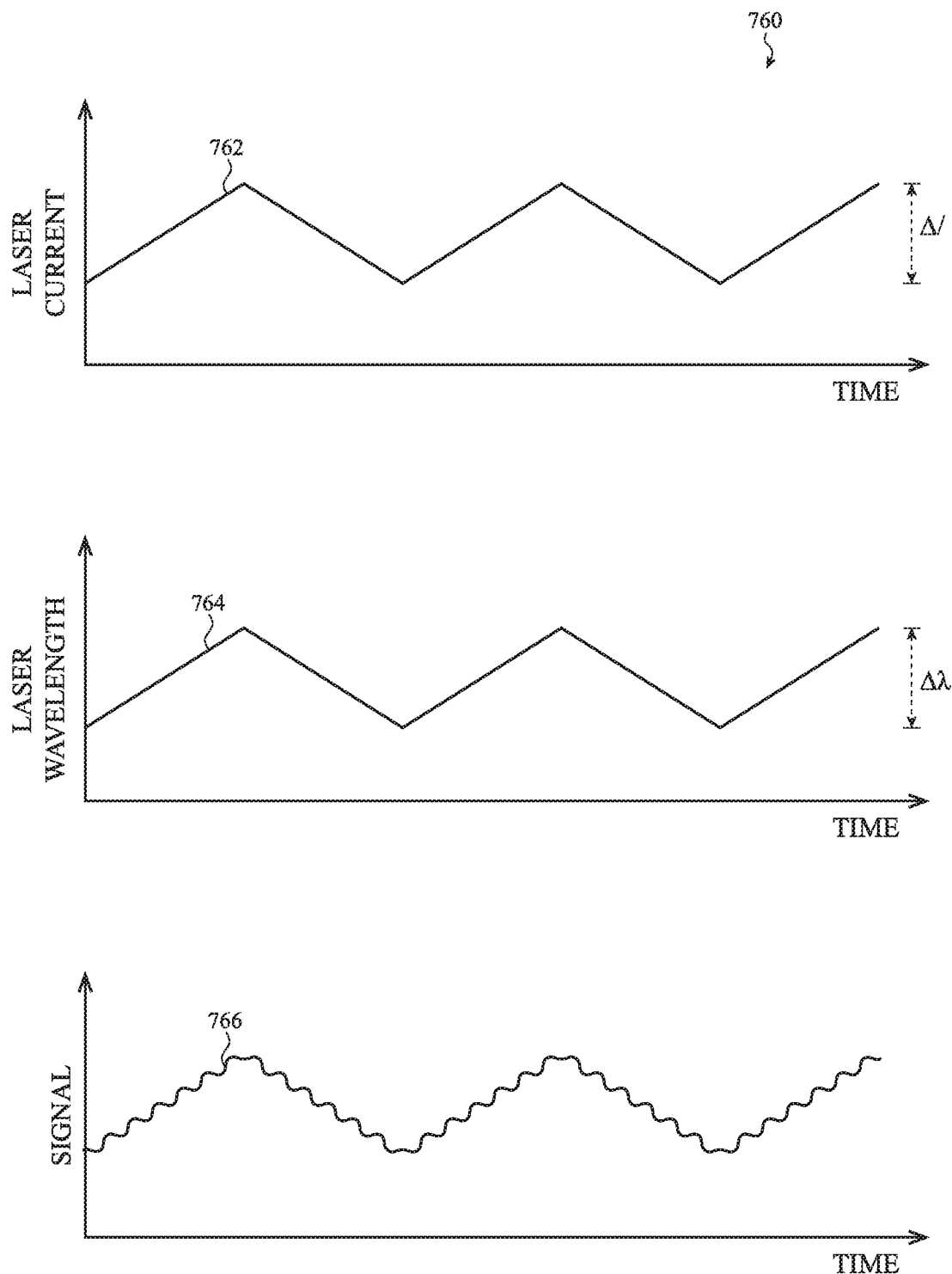
FIG. 7C shows time correlated graphs of a laser current, laser wavelength, and a signal of an interferometric parameter that can be used as part of a spectrum analysis.

FIG. 7C shows time correlated graphs 760 relating a laser current 762 (also called a modulation current) with the resulting laser wavelength 764 and the resulting signal 766 of the measured interferometric parameter. The graphs are under the condition of a user input. By driving a laser with a modulation current, such as the laser current 762, the produced laser light has a laser wavelength 764 that similarly varies according to a triangle wave. As a result of the user input on the touch input surface, the self-mixing interference causes the signal 766 of the interferometric parameter to have the form of a sinusoid (or distorted sinusoid) imposed on a triangle wave. One use of applying the modulation current 762 with a triangle wave is to allow for separate spectrum analyses (e.g., FFTs, as explained with respect to FIG. 7D) of samples taken during the time intervals of the ascending segment and of the descending segment of the triangle waveform modulation of the laser current 762. While the graphs 760 are shown for a triangle waveform modulation of laser current 762, some embodiments may use other alternatingly ascending and descending modulation currents for the laser. Also, while the laser current 762 is shown with equal ascending and descending time intervals, in some embodiments these time intervals may have different durations.

Figure 7D:
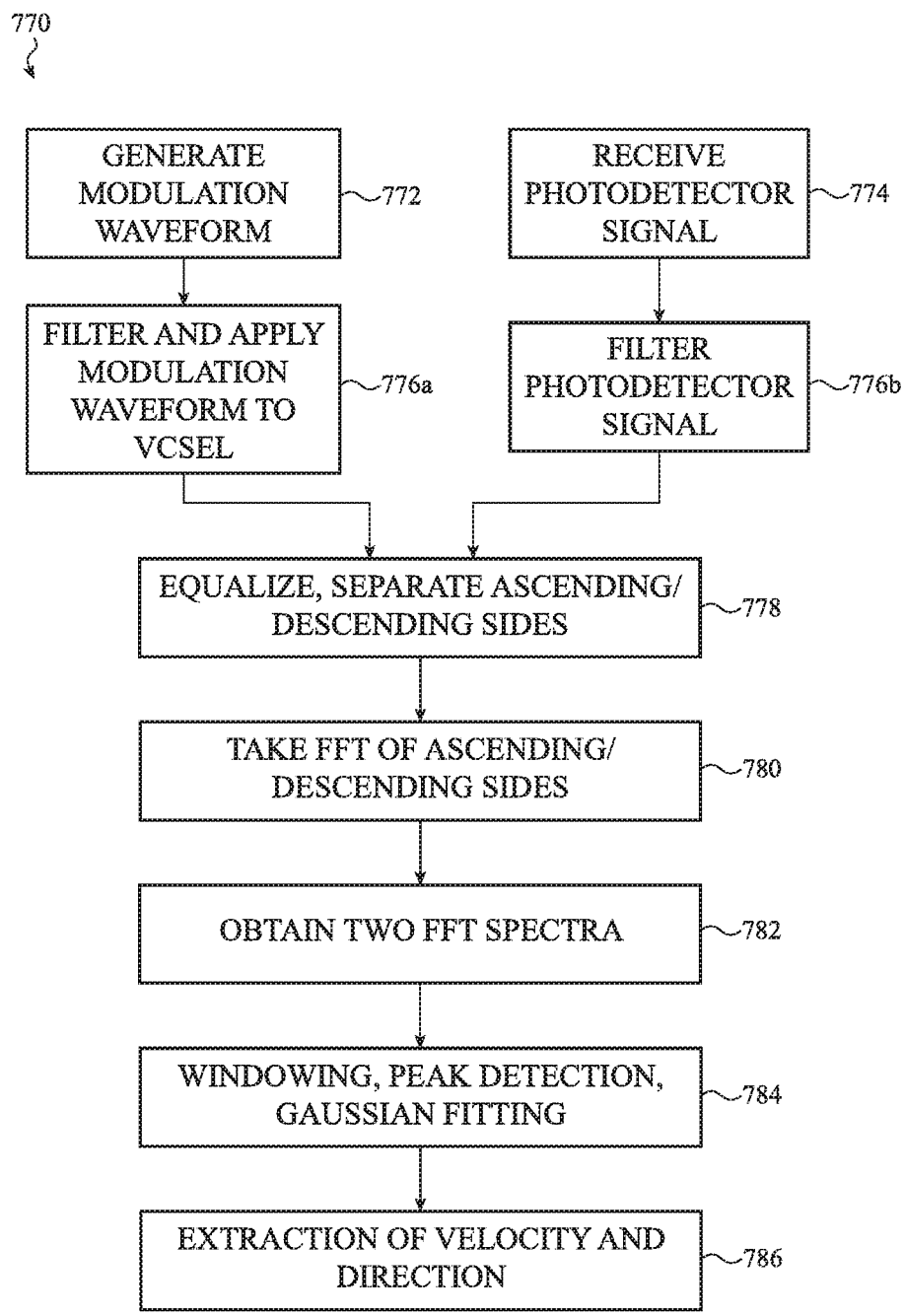
FIG. 7D is a flow chart of a spectrum analysis method for determining speed and direction of a moving target.
Figure 7E:
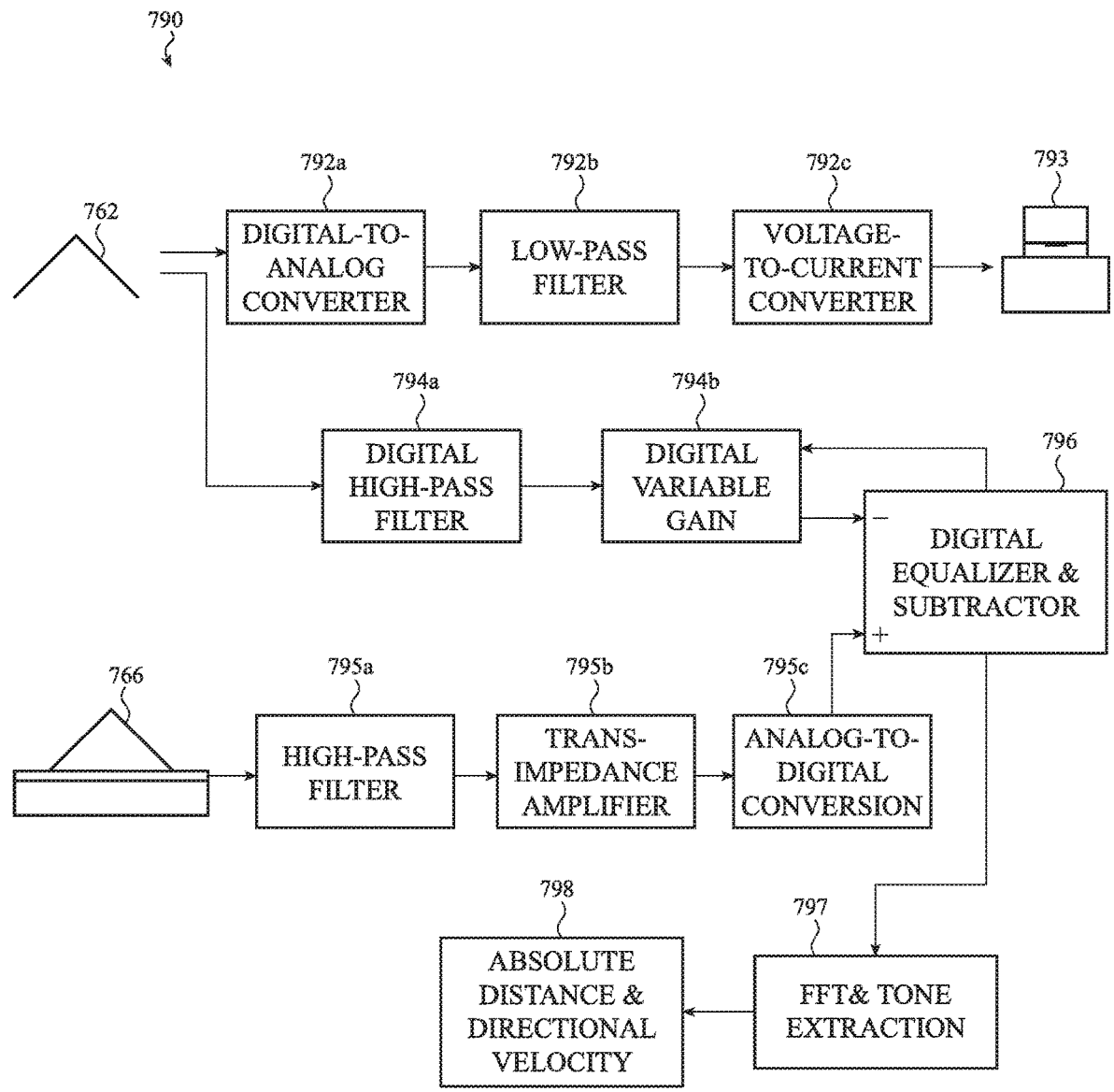
FIG. 7E is a block diagram of a system that implements a spectrum analysis method for determining speed and direction of a moving target.

FIGS. 7D and 7E respectively show a flowchart of a spectrum analysis based method 770 and a block diagram of a system 790 to implement a spectrum analysis procedure that can be used as part of detecting user input and drag motions on a touch input surface. The method 770 and the system 790 may drive or modulate a laser, such as one or more of VCSELs 604a, 604b, and 604c, with a modulation current 762. The method 770 and the system 790 may also analyze a signal 766 related to an interferometric parameter. For purposes of explanation, in the embodiments of FIGS. 7D and 7E it will be assumed that the modulation current 762 has a triangle waveform. One of skill in the art will recognize how the method 770 and the system 790 can be implemented using alternative modulation current waveforms. The method 770 concurrently analyzes the triangle waveform modulation current 762 and the signal 766 of the interferometric parameter. The triangle waveform modulation current 762 and the signal 766 of the interferometric parameter are received at respective receiving circuits. Such receiving circuits may be one or more of the blocks of the system shown in FIG. 7E and described below, or may be one or more dedicated processing units such as a graphics processing unit, an ASIC, or an FPGA, or may include a programmed microcomputer, microcontroller, or microprocessor. Various stages of the method may be performed by separate such processing units, or all stages by one (set of) processing units.

At the initial stage 772 of the method 770, an initial signal is generated, such as by a digital or an analog signal generator. At stage 776a the generated initial signal is processed as needed to produce the triangle waveform modulation current 762 that is applied to the VCSEL. Stage 776a can include, as needed, operations of digital-to-analog conversion (DAC) (such as when the initial signal is an output of a digital step generator), low-pass filtering (such as to remove quantization noise from the DAC), and voltage-to-current conversion.

The application of the triangle waveform modulation current 762 to the VCSEL induces a signal 766 in the interferometric parameter. It will be assumed for simplicity of discussion that the signal 766 of the interferometric parameter is from a photodetector, but in other embodiments it may be another signal of an interferometric parameter from another component. At initial stage 774 of the method 770, the signal 766 is received. At stage 776b, initial processing of the signal 766 is performed as needed. Stage 776b may include high-pass filtering.

At stage 778 the processing unit may equalize the received signals, if necessary. For example the signal 766 may include a predominant triangle waveform component matching the triangle waveform modulation current 762, with a smaller and higher frequency component due to changes in the interferometric parameter. High-pass filtering may be applied to the signal 766 to obtain the component signal related to the interferometric parameter. Also, this stage may involve separating the parts of signal 766 and the triangle waveform modulation current 762 corresponding to the ascending and to the descending time intervals of the triangle waveform modulation current 762. This stage may include sampling the separated information.

At stages 780 and 782, a separate FFT is first performed on the parts of the processed signal 766 corresponding to the ascending and to the descending time intervals. Then the two FFT spectra are analyzed.

At stage 784, further processing of the FFT spectra can be applied, such as to remove artifacts and reduce noise. Such further processing can include windowing, peak detection, and Gaussian fitting.

From the processed FFT spectra data, information regarding the user input can be obtained, including the direction and velocity of the input (such as during a drag motion by the user). A velocity of movement of the touch input surface may be inferred from the average of corresponding peaks (such as the fundamental beat, as shown in FIG. 7A), the distance from the difference of the peaks, and the direction of travel from the larger of the peaks.

FIG. 7E shows a block diagram of a system 790 that can implement the spectrum analysis just described in the method 770. In the exemplary system 790 shown, the system 790 includes generating an initial digital signal and processing it as needed to produce a modulation current 762 as an input to the VCSEL 793. In an illustrative example, an initial step signal may be produced by a digital generator to approximate a triangle function. The digital output values of the digital generator are used in the digital-to-analog (DAC) converter 792a. The resulting voltage signal may then be filtered by the low-pass filter 792b to remove quantization noise. Alternatively, an analog signal generator can be used to generate an equivalent voltage signal directly. The filtered voltage signal then is an input to a voltage-to-current converter 792c to produce the desired modulation current 762 in a form for input to the VCSEL 793.

As described above, deflection (either static, or dynamic such as a finger drag) on a user input surface can cause changes in an interferometric parameter, such as a parameter of the VCSEL 793 or of a photodetector operating in the system. The changes can be measured to produce a signal 766. In the embodiment shown it will be assumed the signal 766 is measured by a photodetector. For the modulation current 762 having the triangle waveform, the signal 766 may be a triangle wave of similar period combined with a smaller and higher frequency signal related to the interferometric parameter.

The signal 766 is first passed into the high-pass filter 795a, which can effectively convert the major ascending and descending ramp components of the signal 766 to DC offsets. As the signal 766 from a photodetector (or a VCSEL in other embodiments) may typically be a current signal, the transimpedance amplifier 795b can produce a corresponding voltage output (with or without amplification) for further processing.

The voltage output can then be sampled and quantized by the analog-to-digital conversion (ADC) block 795c. Before immediately applying a digital FFT to the output of the ADC block 795c, it can be helpful to apply equalization. The initial digital signal values from the digital generator used to produce the triangle waveform modulation current 762 are used as input to the digital high pass filter 794a to produce a digital signal to correlate with the output of the ADC block 795c. An adjustable gain can be applied by the digital variable gain block 794b to the output of the digital high pass filter 794a.

The output of the digital variable gain block 794b is used as one input to the digital equalizer and subtractor block 796. The other input to the digital equalizer and subtractor block 796 is the output of the ADC block 795c. The two signals are differenced, and used as part of a feedback to adjust the gain provided by the digital variable gain block 794b.

Once an optimal correlation is obtained by the feedback, an FFT, indicated by block 797, can then be applied to the components of the output of the ADC block 795c corresponding to the rising and descending of the triangle wave. From the FFT spectra obtained, movement of the user input surface can be inferred, as discussed above and indicated by block 798.

The method just described, and its variations, involve using sampling of a signal of an interferometric parameter and applying spectrum analyses to the samples of a signal. As will now be explained, a second family of embodiments of methods and devices for determining properties of a user input can be obtained directly from the signal of an interferometric parameter using a time domain based analysis without applying a spectrum analysis.

Figure 8A:
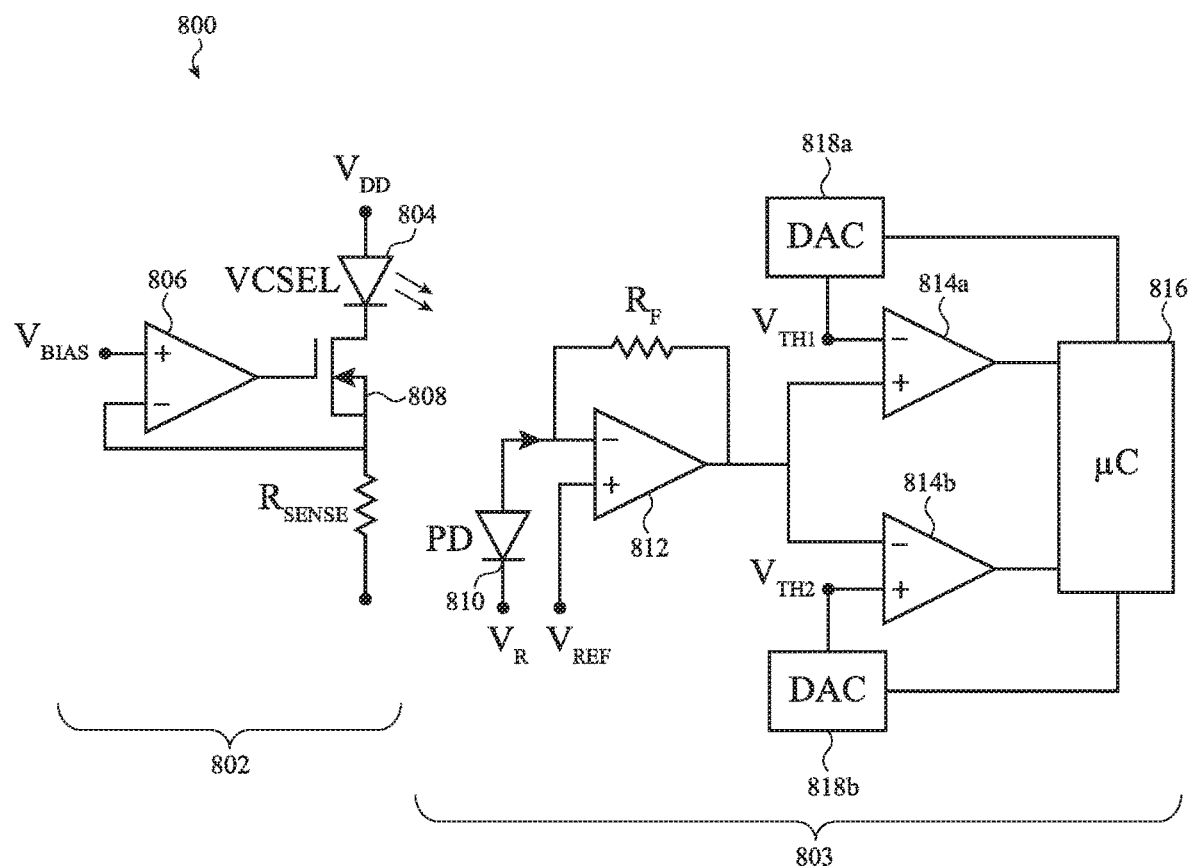
FIG. 8A shows an example of a circuit that can be used with a time domain determination of a speed and direction of a target.
Figure 9A:
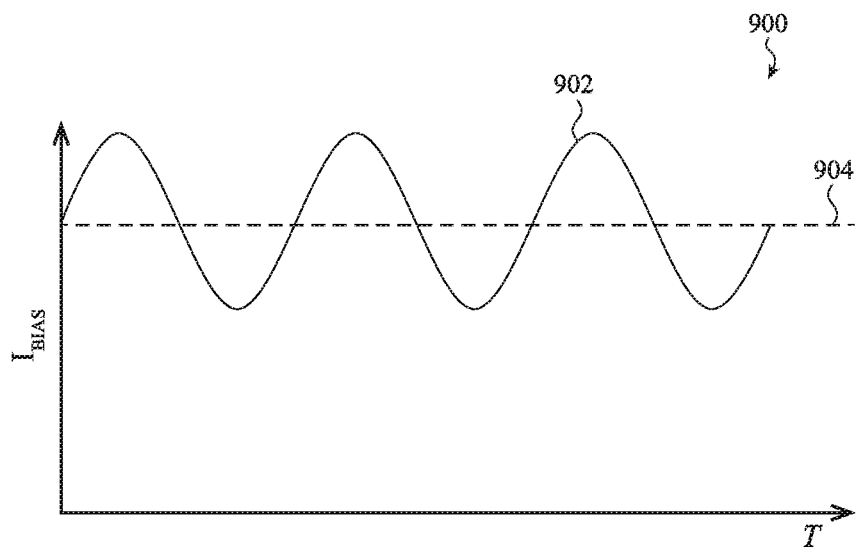
FIGS. 9A and 9B show time correlated graphs for time domain determination of displacement of a target.
Figure 9B:
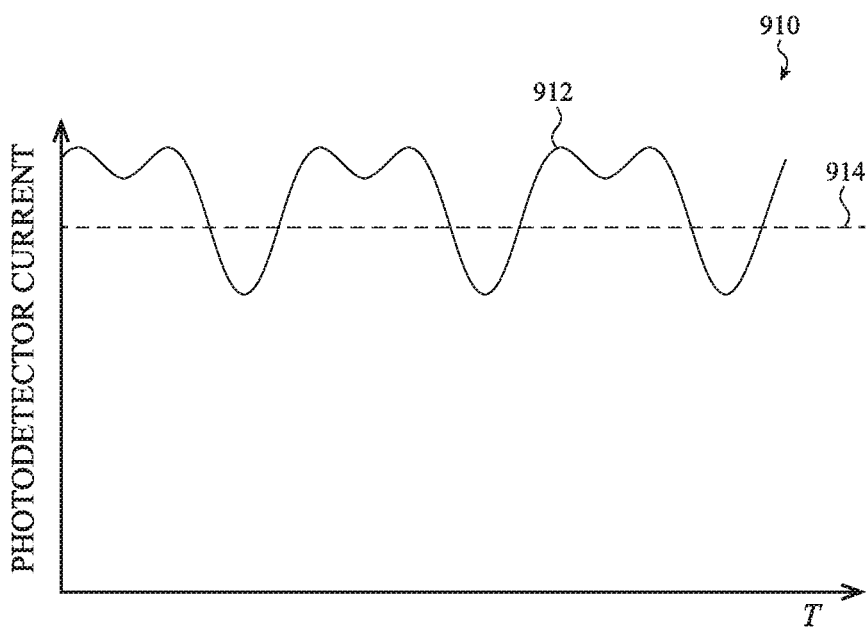

FIG. 8A shows an example of a circuit 800 that can be used to implement a time domain analysis. A time domain analysis can be used to obtain properties of a user input obtained directly from the signal of an interferometric parameter, without applying a spectrum analysis to that signal. The configuration of the circuit 800 is one example of an embodiment, and in some cases the circuit may be otherwise embodied.

The configuration of the circuit 800 includes two sections. The first section 802 includes the laser, in this case the VCSEL 804, and other biasing circuitry. The circuitry includes an amplifier 806 that accepts a bias voltage input and produces an output that drives a gate of transistor 808 positioned at the cathode of the VCSEL 804. This input circuitry can be used to apply the triangle waveform modulation current 762 to the VCSEL 804. Included in section 802 is a sensing resistor.

The second section 803 in the configuration of circuit 800 is a circuit to receive and analyze the signal of the interferometric parameter of the VCSEL 804. In the particular embodiment shown, laser light is received from the VCSEL 804 at a photodiode 810. In other embodiments, such as those that do not use a photodiode, the signal of the interferometric parameter may be a junction voltage, bias current, power, or other electrical property measured in section 802. For example, the current across the sensing resistor in section 802, rather than the shown photodiode current or voltage, may be the input to the amplifier 812. The amplifier 812 can be used for buffering and/or amplifying the received signal of the interferometric parameter.

The output of amplifier 812 is then used as an input to a pair of comparators 814a and 814b. The comparators 814a and 814b can be set at different trigger threshold voltages, $V_{TH1}$ and $V_{TH2}$, to detect rises and falls of the received signal of the interferometric parameter, as will be explained below. The trigger threshold voltages of the comparators 814a and 814b can be controlled by a microcontroller 816 (or other processing unit, as described above). In embodiments in which the microcontroller 816 has digital outputs, the digital outputs thereof can adjust the trigger threshold voltages of the comparators 814a and 814b by first being converted to analog by the digital-to-analog (DAC) converters 818a and 818b.

Figure 8B:
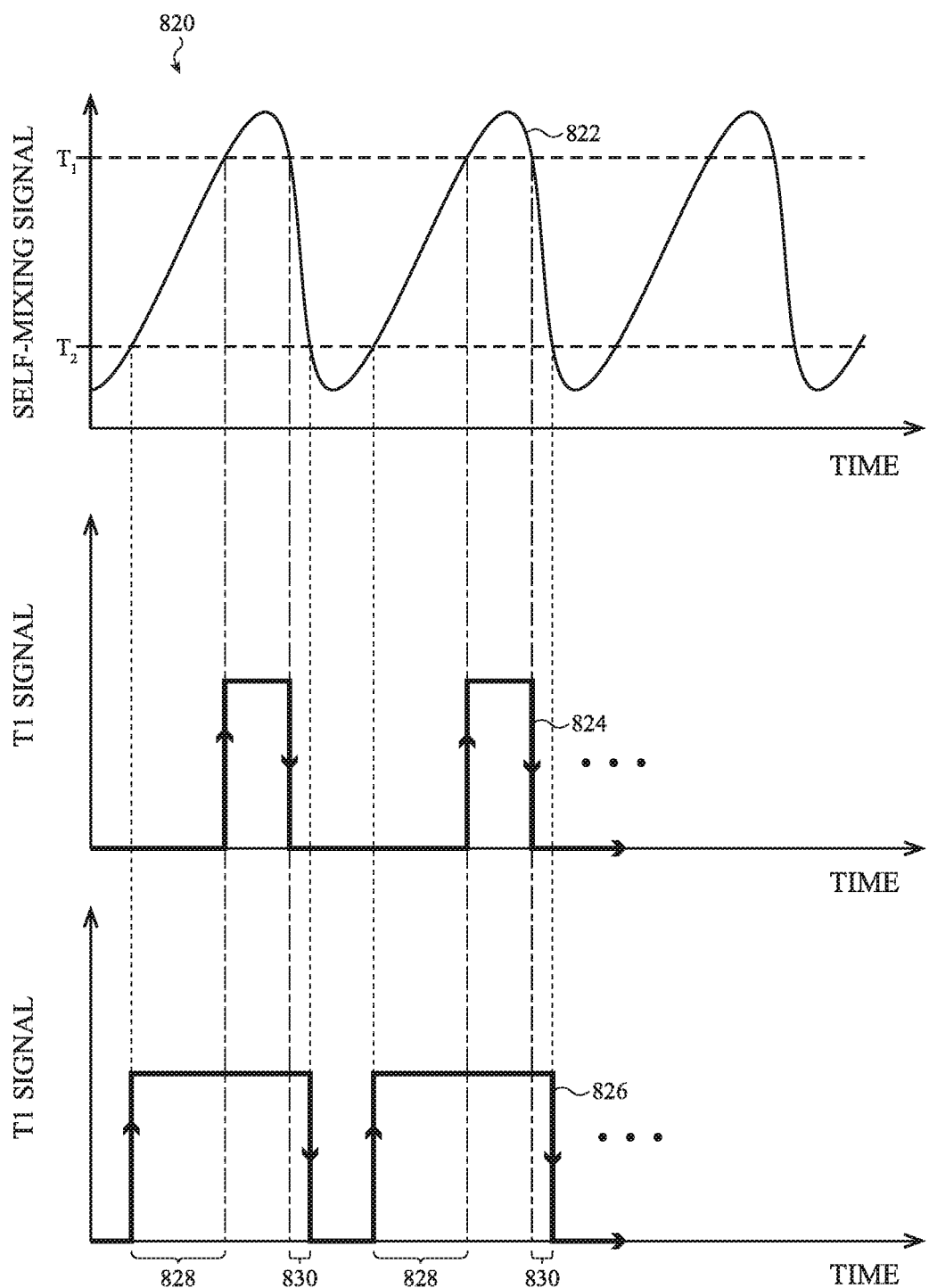
FIG. 8B shows time correlated graphs for a time domain determination of speed and direction of a moving target.

FIG. 8B shows time correlated graphs 820 of a received signal 822 of the interferometric parameter, together with output signals 824 and 826 of the comparators 814a and 814b. The received signal 822 of the interferometric parameter that results from self-mixing is, in the example shown, a distorted sinusoid, as discussed above. The comparator 814a is configured (by the trigger threshold voltage, $V_{TH1}$) to detect when the signal 822 crosses a high threshold, $T_1$, and the comparator 814b is configured (by the trigger threshold voltage, $V_{TH2}$) to detect when the signal 822 crosses a lower threshold, $T_2$.

Because the lower threshold $T_2$ is set lower than the upper threshold $T_1$, the (distorted sinusoid) signal 822 exceeds the lower threshold $T_2$ during a longer time period than the signal 822 exceeds the upper threshold $T_1$. The time period during which the signal 822 exceeds the upper threshold $T_1$ is a subperiod of the time period during which the signal 822 exceeds the lower threshold $T_2$. As a consequence, there is a first time interval 828 between when comparator 814b triggers 'on' until when comparator 814a triggers 'on.' This is termed the time difference between rising edges. Similarly, there is a second time interval 830 between when comparator 814a triggers 'off' until when comparator 814b triggers 'off.' This is termed the time difference between falling edges.

The difference in lengths of time of the first time interval 828 (where the first time interval 828 may correspond to the rising edge time of the signal 822), and the second time interval 830 (where the second time interval 830 may correspond to the falling edge time of the signal 822) can be used to determine properties of the user input. In the example shown, the user input is moving toward the laser, so that the signal 822 has a sinusoidal shape distorted to the right. As a result, the rising edge time of the first time interval 828 exceeds the falling edge time of the second time interval 830. The excess can imply a direction of motion of the user input. Also, the durations of the time periods during which the signal 822 exceeds the lower threshold T.sub.1 and exceeds the upper threshold T.sub.2 may also be used to aid in determining the speed of the user input.

Figure 8C:
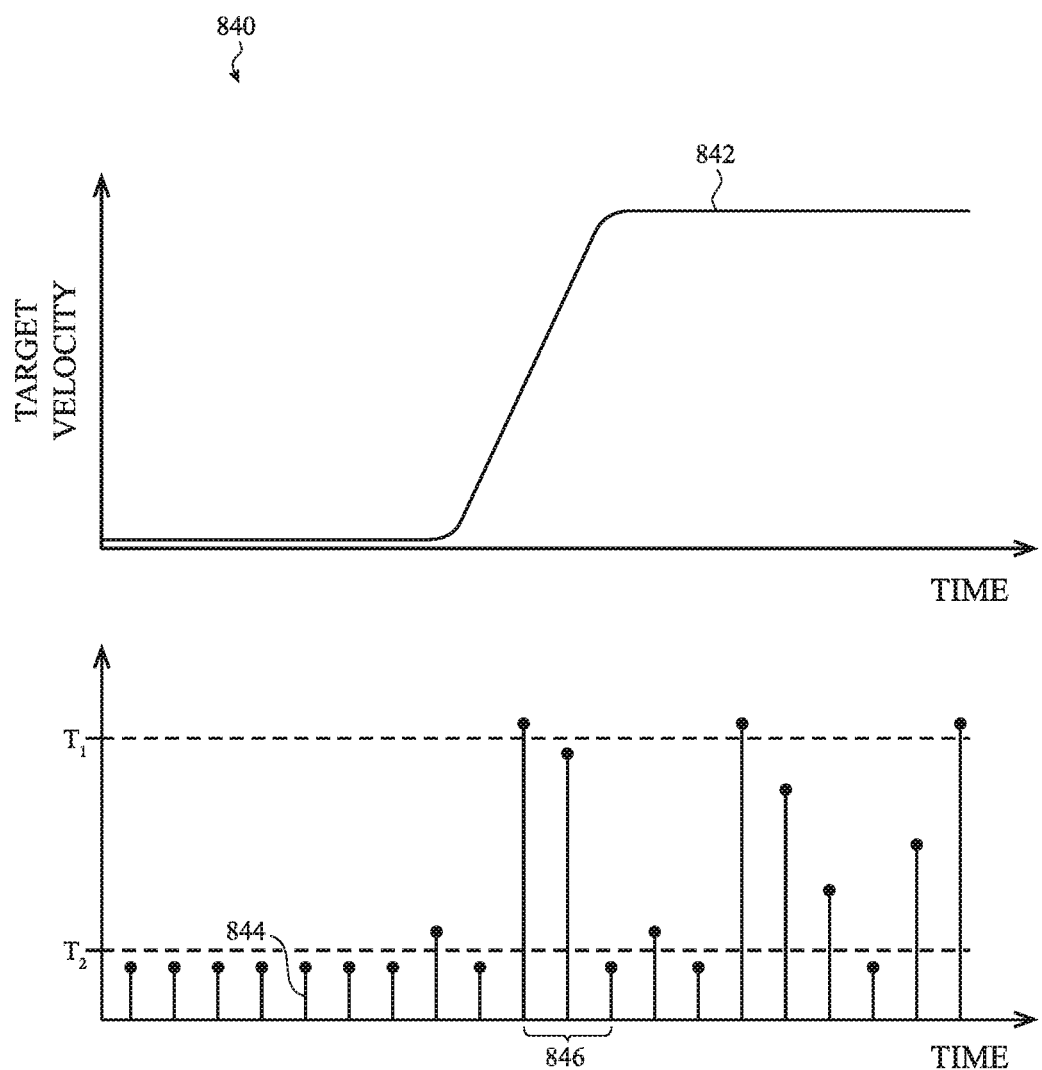
FIG. 8C shows time correlated graphs of a target velocity and a sampled output of the circuit of FIG. 8A.

FIG. 8C shows time correlated graphs 840 that show a target velocity 842 can produce detectable changes in a sampled self-mixing signal 844. In this embodiment, the sampled self-mixing signal 844 can be a direct sampling of the received self-mixing signal that is the output of the amplifier 812. The sampling period can be chosen to be able to detect rapid changes in the target velocity due to user input. The sampled self-mixing signal 844 shown may, for example, represent samples of the continuous time signal 822.

In the correlated graphs 840, the target velocity 842 is initially zero (or approximately so), such as may occur under no user input. After initiation of a user input, the target velocity 842 shows an initial increase before stabilizing, such as may occur for a uniform applied pressure of user input. As a result, the sampled self-mixing signal 844 can, as for the continuous self-mixing signal, alternatingly exceed the upper threshold $T_1$ and then fall back below the lower threshold $T_2$. The time interval 846 from exceeding the upper threshold $T_1$ until being below the lower threshold $T_2$ can be related to the target velocity. Similarly, a time from a sample being below the lower threshold $T_2$ until the next sample being above the upper threshold $T_1$ may also be used to determine the target velocity or other properties of the user input.

For detection of a drag motion of the user input, the time domain analysis method just described can be used with the configuration of three VCSELs shown in FIG. 6B. One (or more) VCSELs can be used to determine motion of a user input in the X-direction and one (or more) VCSELs can be used to determine motion of the user input in the Y-direction, as explained previously. Further, the time domain analysis methods may make use of time-multiplexing of the lasers, as discussed in relation to FIG. 6C.

A third family of embodiments of methods and devices for determining properties of a user input can be obtained directly from the signal of an interferometric parameter and using a different time domain based analysis. This family is described in relation to FIGS. 9 and 10. The methods and devices make use of a sinusoidal modulation of a bias current of the laser diode and detects resulting effects in an interferometric parameter of a photodetector associated with the laser diode.

In this family of embodiments, a laser light source, such VCSEL 302 of FIG. 3A, is used to direct laser light at an input surface, such as the touch input surface 320 of FIG. 3A. For simplicity of explanation only for this family of embodiments, the laser light source(s) will be assumed to be VCSEL(s). In this family of embodiments, there may be one or more photodetectors associated with each VCSEL, at least one of whose output parameters is correlated with a property of the self-mixing of the laser light that arises when some of the laser light emitted from the VCSEL is received back into the VCSEL after reflection from a target. In some embodiments, the photodetector is integrated as part of the VCSEL, such as at the location of the mirror 402 in FIG. 4B. Instead of, or in addition to, an output of a photodetector, some embodiments may measure an interferometric property of the VCSEL itself, such as a junction voltage.

The self-mixing laser light that impinges on the photodetector contains at least two contributions: a first contribution from internal reflections at the light exit surface of the VCSEL and a second contribution from reflections from the target, as indicated in FIG. 4B. The second contribution enters the laser cavity phase shifted from the first. The radian value of the phase shift can be expressed as $\Delta\varphi = 2\pi[2L \mod \lambda]$, or equivalently as $$2\pi\left(\frac{2L}{\lambda} - \left\lfloor\frac{2L}{\lambda}\right\rfloor\right),$$

where $\lambda$ is the wavelength of the laser light.

The bias current of a VCSEL may be driven by electronics, or other means, to include a superimposed sinusoidal modulation component, to have the form $I_{BIAS} \propto 1 + \beta \sin(\omega_m t)$, where $\beta$ is typically less than 1, and $\omega_m$ is the radian modulation frequency. The radian modulation frequency $\omega_m$ is much less than the frequency of the laser light. When a VCSEL is driven with such a bias current, the self-mixing laser light is such that $\Delta\varphi \propto a + b \sin(\omega_m t)$, for constants a and b. The specific forms for constants a and b for some embodiments will be presented below.

When the two reflected contributions impinge on the photodetector, the phase shift between them can cause their electric fields to interfere, either destructively or constructively. As a result, an output current of the photodetector can have the form $I_{PD} \propto [1 + \delta \cos(\Delta\varphi)]$.

The Fourier series expansion of the function $\cos(a + b \sin(\omega_m t))$ has the form $\mathcal{F}\{\cos(a + b\sin(\omega_m t))\} = J_0(b)\cos(a) - 2J_1(b)\sin(a)\sin(\omega_m t) + 2J_2(b)\cos(a)\cos(2\omega_m t) - 2J_3(b)\sin(a)\sin(3\omega_m t) + $ higher order harmonics, where $J_k$ indicates the Bessel function of the first kind of order k. So for the situation above of a sinusoidally modulated bias current of a VCSEL, the photodetector output current has a harmonics of the radian modulation frequency that can be selected by filtering, and the respective coefficient values that can be determined by demodulation, as explained in relation to FIG. 10 below.

For a target that had an initial distance $L_0$ from the VCSEL, and which has undergone a displacement of $\Delta L$ from $L_0$, the constants a and b above are given by:

$a = [4\pi(L_0 + \Delta L)/\lambda]$, and $b = [-4\pi\Delta\lambda(L_0 + \Delta L)\lambda^2]$.

The specific form of the expansion for $I_{PD}$ may be given by:

$$I_{PD} \propto \text{Baseband Signal} - 2J_1\left[\frac{-4\pi\Delta\lambda L_0}{\lambda^2}\left(1 + \frac{\Delta L}{L_0}\right)\right]\sin\left(\frac{4\pi\Delta L}{\lambda}\right)\sin(\omega_m t) +$$
$$2J_2\left[\frac{-4\pi\Delta\lambda L_0}{\lambda^2}\left(1 + \frac{\Delta L}{L_0}\right)\right]\cos\left(\frac{4\pi\Delta L}{\lambda}\right)\cos(2\omega_m t) -$$
$$2J_3\left[\frac{-4\pi\Delta\lambda L_0}{\lambda^2}\left(1 + \frac{\Delta L}{L_0}\right)\right]\sin\left(\frac{4\pi\Delta L}{\lambda}\right)\sin(3\omega_m t) + \ldots$$

By defining a Q-component of $I_{PD}$ as a low pass filtering and demodulation with respect to the first harmonic, i.e. $Q \propto \text{Lowpass}\{I_{PD} \times \sin(\omega_m t)\}$, and an I-component as a low pass filtering and demodulation with respect to the second harmonic, i.e. $I \propto \text{Lowpass}\{I_{PD} \times \cos(2\omega_m t)\}$, one can obtain a first value $$Q \propto \sin\left(\frac{4\pi\Delta L}{\lambda}\right),$$

and a second value $$I \propto \cos\left(\frac{4\pi\Delta L}{\lambda}\right).$$

Then one can use the unwrapping arctan function (that obtains an angle in any of all four quadrants) to obtain the displacement as $$\Delta L = \frac{\lambda}{4\pi}\arctan(Q/I).$$

In a modification of this implementation of the low pass filtering and demodulation, a Q'-component of $I_{PD}$ can be defined as a low pass filtering and demodulation with respect to the third harmonic, i.e. $Q \propto \text{Lowpass}\{I_{PD} \times \sin(3\omega_m t)\}$. This can then be used with the I-component derived by filtering and demodulation at the second harmonic, as above, to obtain a modified first value $$Q' \propto \sin\left(\frac{4\pi\Delta L}{\lambda}\right),$$

and the second value $$I \propto \cos\left(\frac{4\pi\Delta L}{\lambda}\right).$$

Then, as before, one can use the unwrapping arctan function (that obtains an angle in any of all four quadrants) to obtain the displacement as $$\Delta L = \frac{\lambda}{4\pi}\arctan(Q'/I).$$

This modification makes use of frequency components of $I_{PD}$ separate from the original modulation frequency applied to the VCSEL bias current $I_{BIAS}$. This may reduce the need for filtering and/or isolation of $I_{PD}$ at the original modulation frequency $\omega_m$.

In a still further modification, one can use the form of the Baseband Signal (DC signal component) in the expansion above to obtain an alternative I-component derived by filtering and demodulation at the DC component:

$$I' \propto \cos\left(\frac{4\pi\Delta L}{\lambda}\right).$$

This alternative I-component can then be used with the Q-component above to obtain $$\Delta L = \frac{\lambda}{4\pi}\arctan(Q/I').$$

The low pass filtering and demodulations just discussed can be further explained in relation to FIGS. 9A-B and FIG. 10.

FIGS. 9A-B show two time correlated graphs: 900, 910. Graph 900 shows a plot 902 of a bias current $I_{BIAS}$ of a VCSEL modulated by a sine wave at a single frequency. The amplitude of the sinusoidal modulation is only for illustration, and need not correspond to amplitudes in all embodiments. The bias current $I_{BIAS}$ has its sinusoidal variation about a fixed direct current value, 904.

As a result of the sinusoidal modulation, the output current of a photodetector receiving the VCSEL's self-mixing laser light undergoes a time variation, shown in the plot 912 in the graph 910. The time axes of graphs 900 and 910 are correlated. The plot 912 illustrates that the output current of the photodetector varies around a fixed direct current value 914.

The sinusoidally modulated bias current $I_{BIAS}$ and corresponding photodetector current may arise within the circuit shown in FIG. 10, as now described. Other circuits may be used to implement the time domain I/Q methods just described, and may produce bias currents and respective photodetector currents having respective plots similar to 902 and 912.

FIG. 10 shows an exemplary circuit block diagram that may be used to implement this third family embodiments. Other circuits may also be used, as would be clear to one skilled in the art. The circuit block diagram of FIG. 10 shows the relationship and connections of certain components and sections; other circuits that implements these embodiments may use more or fewer components. As explained in more detail below, FIG. 10 shows components which generate and apply a sinusoidally modulated bias current to a VCSEL. The sinusoidal bias current can generate in a photodetector 1016 an output current depending on the frequency of the sinusoidal bias and the displacement to the target. In the circuit of FIG. 10, the photodetector's 1016 output current is digitally sampled and then multiplied with a first sinusoid at the frequency of the original sinusoidal modulation of the bias current, and a second sinusoid at double that original frequency. The two separate multiplied outputs are then each low pass filtered and the phase calculated. Thereafter the displacement is determined using at least the phase.

The DC voltage generator 1002 is used to generate a constant bias voltage. A sine wave generator 1004 may produce an approximately single frequency sinusoid signal, to be combined with constant voltage. As shown in FIG. 10, the sine wave generator 1004 is a digital generator, though in other implementations it may produce an analog sine wave. The low pass filter 1006A provides filtering of the output of the DC voltage generator 1002 to reduce undesired varying of the constant bias voltage. The bandpass filter 1006B can be used to reduce distortion and noise in the output of the sine wave generator 1004 to reduce noise, quantization or other distortions, or frequency components of its signal away from its intended modulation frequency, $\omega_m$.

The circuit adder 1008 combines the low pass filtered constant bias voltage and the bandpass filtered sine wave to produce on link 1009 a combined voltage signal which, in the embodiment of FIG. 10, has the form $V_0 + V_m \sin(\omega_m t)$. This voltage signal is used as an input to the voltage-to-current converter 1010 to produce a current to drive the lasing action of the VCSEL 1014. The current from the voltage-to-current converter 1010 on the line 1013 can have the form $I_0 + I_m \sin(\omega_m t)$.

The VCSEL 1014 is thus driven to emit a laser light modulated as described above. Reflections of the modulated laser light may then be received back within the lasing cavity of VCSEL 1014 and cause self-mixing interference. The resulting self-mixing interference light may be detected by photodetector 1016. As described above, in such cases the photocurrent output of the photodetector 1016 on the link 1015 can have the form: $i_0+i_m \sin(\omega_m t)+\gamma \cos(\varphi_0+\varphi_m \sin(\omega_m t))$. As the I/Q components to be used in subsequent stages are based on just the third term, the first two terms can be removed or reduced by the differential transimpedance amplifier and anti-aliasing (DTIA/AA) filter 1018. To do such a removal/reduction, a proportional or scaled value of the first two terms is produced by the voltage divider 1012. The voltage divider 1012 can use as input the combined voltage signal on the link 1009 produced by the circuit adder 1008. The output of the voltage divider 1012 on link 1011 can then have the form $\alpha(V_0+V_m \sin(\omega_m t))$. The photodetector current and this output of the voltage divider 1012 can be the inputs to the DTIA/AA filter 1018. The output of the DTIA/AA filter 1018 can then be, at least mostly, proportional to the third term of the photodetector current.

The output of the DTIA/AA filter 2018 may then be quantized for subsequent calculation by the analog-to-digital converter (ADC) 1020. Further, the output of the ADC 1020 may have residual signal component proportional to the sine wave originally generated by the sine wave generator 1004. To filter this residual signal component, the originally generated sine wave can be scaled (such as by the indicated factor of $\beta$) at multiplier block 1024C, and then subtracted from the output of ADC 1020. The filtered output on link 2021 may have the form $A+B \sin(\omega_m t)+C \cos(2\omega_m t)+ \ldots$, from the Fourier expansion discussed above. The filtered output can then be used for extraction of the I/Q components by mixing.

The digital sine wave originally generated by sine wave generator 1004 onto link 1007 is mixed (multiplied) by the multiplier block 1024A with the filtered output on link 1007. This product is then integrated and low pass filtered at block 1028A to obtain the Q component discussed above.

Also, the originally generated digital sine wave is used as input into the squaring/filtering block 1026 to produce a digital cosine wave at a frequency double that of the originally produced digital sine wave. The digital cosine wave is then mixed (multiplied) at the multiplier component 1024B with the filtered output of the ADC 1020 on link 1021. This product is then integrated and low pass filtered at component 1028B to obtain the I component discussed above.

The Q and the I components are then used by the phase calculation component 1030 to obtain the phase, from which the displacement of the target can be calculated, as discussed above.

One skilled in the art will appreciate that while the embodiment shown in FIG. 10 makes use of the digital form of the originally generated sine wave produced by sine wave generator 1004 onto link 1007, in other embodiments the originally generated sine wave may be an analog signal and mixed with an analog output of the DTIA/AA 1018.

The circuit of FIG. 10 can be adapted to implement the modified I/O method described above that uses $Q' \propto \text{Lowpass}\{I_{PD} \times \sin(3\omega_m t)\}$. Some such circuit adaptations can include directly generating both mixing signals $\sin(2\omega_m t)$ and $\sin(3\omega_m t)$, and multiplying each with the output of the ADC block 1020, and then applying respective low pass filtering, such as by the blocks 1028a,b. The differential TIA and anti-aliasing filter may then be replaced by a filter to remove or greatly reduce the component of $I_{PD}$ at the original modulation frequency $\omega_m$. One skilled in the art will recognize other circuit adaptations for implementing this modified I/Q method.

The I/Q time domain based methods just described may be used with the spectral based methods of the first family of embodiments. The spectral methods of the first family can be used at various times to determine the absolute distance to the target, and provide a value of $L_0$, after which any of the various I/Q methods just described may be used to determine $\Delta L$.

The I/Q time domain based methods may be used to determine a velocity of motion of a user input on a touch input surface by using the three VCSEL configuration of FIGS. 6A and 6B. For one or more of the three VCSELs, the I/Q method can be used to determine displacements at more than one time instance. From the difference in time and the change in displacement(s), a speed and direction can be obtained.

In any of the embodiments described, light emitted by the lasers may be directed by lenses as part of detecting a presence of a user input, or a motion of the user input across the touch input surface. For example, the VCSELs 604a and 604b may be associated with lenses so that their respective coherent lights are directed with horizontal components. Such lenses will now be described.

FIGS. 11A-E show cross sections 1100A-E of shapes of lenses that may be positioned on or near the surface through which the coherent light of the laser or VCSEL is emitted, or may be positioned at locations between the laser and the touch input surface. The lenses can serve to redirect the emitted coherent light from a first direction to a second direction. Such a redirection allows the emitted coherent light to intersect or impinge on the touch input surface at an angle that is not perpendicular to the touch input surface, as described above. The lenses may be made from a molded polymer, a silicon hydride, glass, or other optically transmissive material. In the following detailed descriptions like numbers denote like elements.

In FIGS. 11A-E, the laser or VCSEL 1102 is depicted emitting its coherent light horizontally and perpendicularly from a substrate to which it is attached, though this is only for explanation and is not required. In these figures, the emitted light 1107 is shown emerging from a surface of a surrounding material with surface 1106, then passing through a cover glass 1110 to impinge or intersect with the target 1108. In some embodiments the surrounding material with surface 1106 may be a solid transmissive material, or may be air or other gas with surface 1106 being a thin transmissive layer above the air.

Figure 11A:
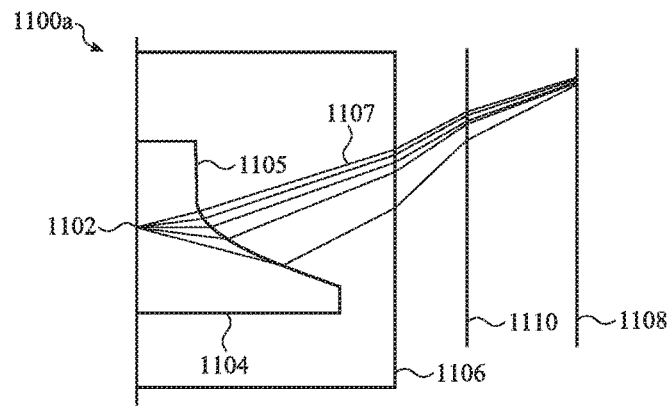
FIGS. 11A-E show example cross sections of lenses that can be used with lasers in a system for detecting user input.

FIG. 11A shows a cross section 1100a of a single-sided freeform lens 1104. In this embodiment, the lens 1104 has a concave surface 1105 shaped to redirect the coherent laser light at an angle as well as provide focusing. In this embodiment the surface element 1106 is planar layer.

Figure 11B:
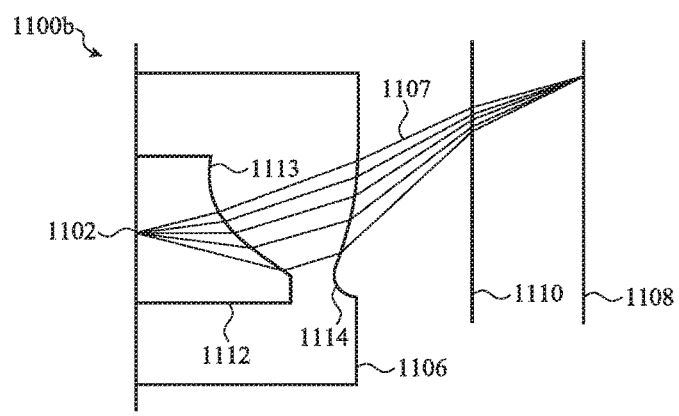

FIG. 11B shows a cross section 1100b of a double-sided freeform lens 1112. In this embodiment the lens 1112 has a concave surface 1113 shaped to redirect the coherent laser light at an angle as well as provide focusing. In this embodiment, the surface element 1106 is shaped with a curve to provide further lensing.

Figure 11C:
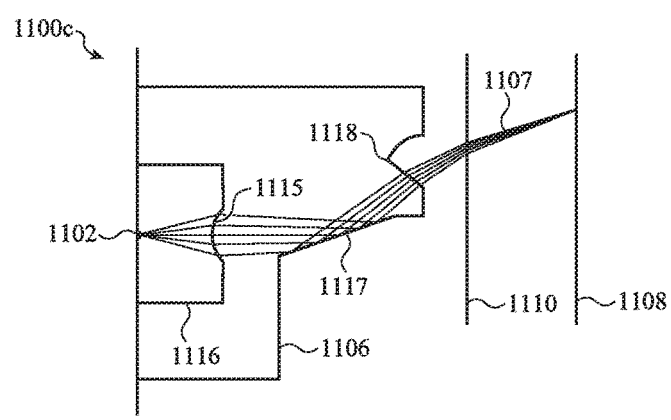

FIG. 11C shows a cross section 1100c of a conic lens 1116 with curved surface 1115. In this embodiment, the surface 1106 is shaped to have multiple linear segments. In this embodiment the segment 1117 of surface 1106 is oriented and/or made of a material so that the coherent light 1107 emerging from the curved surface 1115 of lens 1116 undergoes total internal reflection from the segment 1117 and then emerges from the segment 1118.

Figure 11D:
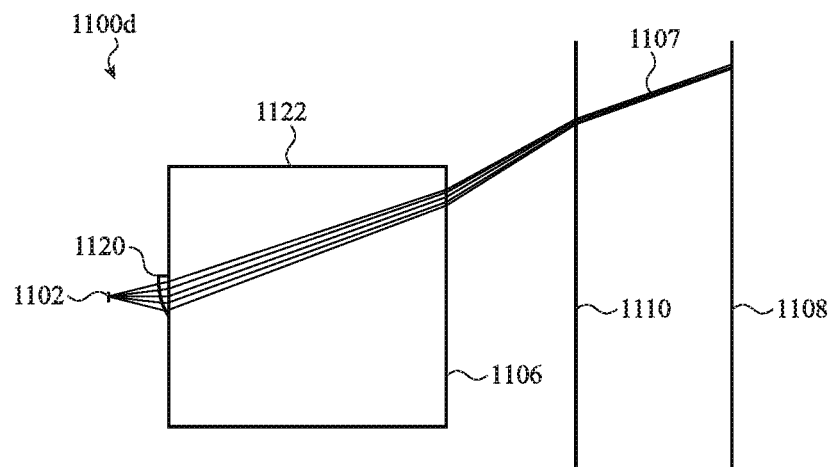

FIG. 11D shows a cross section 1100d having a single-sided freeform lens 1122. In this embodiment, the lens 1122 is positioned to form a gap between itself and the laser 1102. In this embodiment, the surface 1106 of the lens 1122 includes a convex (i.e., curved towards the laser 1102) surface segment 1120 to deflect the light 1107.

Figure 11E:
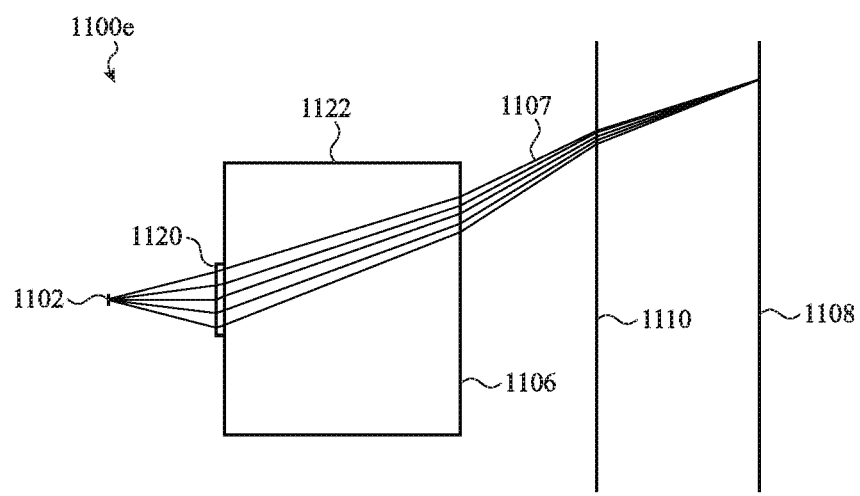

FIG. 11E shows a cross section 1100e having a lens 1124 that is positioned to form a gap between itself and the laser 1102. In this embodiment, the lens 1124 includes diffractive optic grating 1126 positioned on the segment of the surface 1106 that is adjacent to the laser 1102. In one embodiment, the diffractive optic grating 1126 may be implemented as chromium on glass, or as a phase-etched binary diffractive optic grating.

Figure 12:
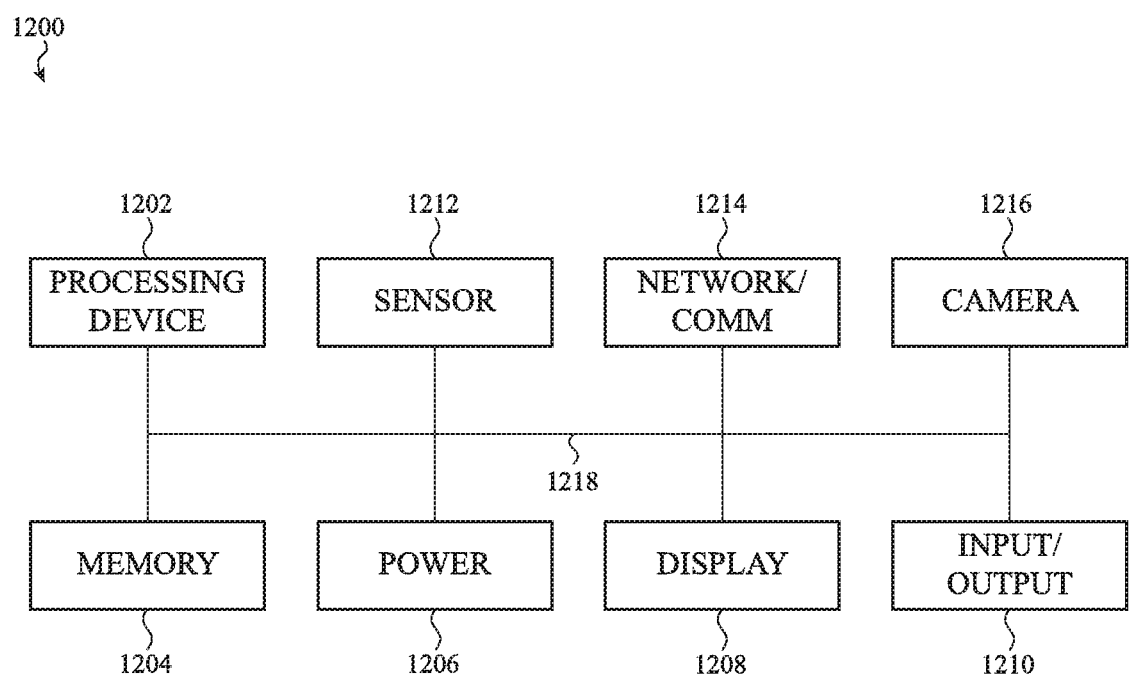
FIG. 12 shows an example block diagram of components of an electronic device that includes a system for detecting user input.

Referring now to FIG. 12, there is shown a block diagram of an electronic device that may include a touch input surface as described in the embodiments. The electronic device 1200 can include one or more processors or processing unit(s) 1202, storage or memory components 1204, a power source 1206, a display 1208 (which may include the touch input surface), input/output interface 1210 (which may include lasers such as VCSELs for detecting user input on the touch input surface), one or more sensors 1212 (which may include photodetectors as discussed in the embodiments above), a network communication interface 1214, and one or more cameras 1216, each of which will be discussed in turn below. The input touch screen may be a component of the display 1208, the input/output interface 1210, or another component of the electronic device.

The one or more processors or processing units 1202 can control some or all of the operations of the electronic device 1200. The processor(s) 1202 can communicate, either directly or indirectly, with substantially all of the components of the electronic device 1200. In various embodiments the processing units 1202 may receive the signals from photodetectors and/or the electronics of a VCSEL that correspond to the interferometric parameters, and perform the spectrum analyses of the signals discussed above.

For example, one or more system buses 1218 or other communication mechanisms can provide communication between the processor(s) or processing units 1202, the storage or memory components 1204 (or just "memory"), the power source 1206, the display 1208, the input/output interface 1210, the sensor(s) 1212, the network communication interface 1214, and the one or more cameras 1216. The processor(s) or processing units 1202 can be implemented as any electronic device capable of processing, receiving, or transmitting data or instructions. For example, the one or more processors or processing units 1202 can be a microprocessor, a central processing unit (CPU), an application-specific integrated circuit (ASIC), a digital signal processor (DSP), or combinations of multiple such devices. As described herein, the term "processor" or "processing unit" is meant to encompass a single processor or processing unit, multiple processors, multiple processing units, or other suitably configured computing element or elements.

The memory 1204 can store electronic data that can be used by the electronic device 1200. For example, the memory 1204 can store electrical data or content such as, for example, audio files, document files, timing signals, algorithms, and image data. The memory 1204 can be configured as any type of memory. By way of example only, memory 1204 can be implemented as random access memory, read-only memory, Flash memory, removable memory, or other types of storage elements, in any combination.

The power source 1206 can be implemented with any device capable of providing energy to the electronic device 1200. For example, the power source 1206 can be a battery or a connection cable that connects the electronic device 1200 to another power source such as a wall outlet.

The display 1208 may provide an image or video output for the electronic device 1200. The display 1208 can be substantially any size and may be positioned substantially anywhere on the electronic device 1200. In some embodiments, the display 1208 can be a liquid display screen, a plasma screen, or a light emitting diode screen. The display 1208 may also function as a touch input surface, as described in the embodiments, in addition to displaying output from the electronic device 1200. In these embodiments, a user may press on the display 1208 in order to provide input to the electronic device 1200.

The input/output interface 1210 can receive data from a user or one or more other electronic devices. The I/O interface 1210 can include a display, a touch input surface such as a described in the embodiments above, a track pad, one or more buttons, one or more microphones or speakers, one or more ports such as a microphone port, and/or a keyboard.

In addition to photodetectors and monitors of VCSEL properties, the one or more sensors 1212 may include other types of sensors. Examples of sensors include, but are not limited to, light sensors such as light emitting sensors and/or light detection sensors, audio sensors (e.g., microphones), gyroscopes, and accelerometers. Example light emitting sensors include but are not limited to the VCSELs described above. Other example light detection sensors include, but are not limited to, sensors that include optical or photodetectors such as photodiodes and photoresistors. The sensor (s) 1212 can be used to provide data to the processor 1202, which may be used to enhance or vary functions of the electronic device.

The network communication interface 1214 can facilitate transmission of data to a user or to other electronic devices. For example, in embodiments where the electronic device 1200 is a smart telephone, the network communication interface 1214 can receive data from a network or send and transmit electronic signals via a wireless or wired connection. Examples of wireless and wired connections include, but are not limited to, cellular, WiFi, Bluetooth, and Ethernet. In one or more embodiments, the network communication interface 1214 supports multiple network or communication mechanisms. For example, the network communication interface 1214 can pair with another device over a Bluetooth network to transfer signals to the other device while simultaneously receiving signals from a WiFi or other wired or wireless connection.

The one or more cameras 1216 can be used to capture images or video. The image sensor can be implemented as any suitable image sensor, such as a complementary metal-oxide-semiconductor (CMOS) image sensor. The camera(s) include an optical system that is in optical communication with the curved image sensor. The optical system can include conventional elements such as a lens, a filter, an iris, and a shutter. Various elements of the camera 1216, such as the optical system and/or the image sensor, can be controlled by timing signals or other signals supplied from the processor 1202 and/or the memory 1204.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed.

What is claimed is:

1. An electronic device comprising:
   a user input surface on the electronic device;
   a module having a first wall and a second wall opposite the first wall;
   a set of lenses mounted in the first wall of the module and projecting into the module;
   a set of vertical-cavity surface-emitting lasers (VCSELs) housed within the module and mounted on the second wall of the module, each VCSEL emitting a beam of coherent light toward the user input surface, and each beam including a first amount of coherent light generated by the VCSEL and a second amount of coherent light reflected from the user input surface into the VCSEL and mixed with the first amount of coherent light;
   a set of sensors; and
   a reflector positioned to deflect in response to a deflection of the user input surface, wherein:
      a first beam of coherent light emitted by a first VCSEL in the set of VCSELs reflects off of the reflector;
      a second beam of coherent light emitted by a second VCSEL in the set of VCSELs passes through a first lens in the set of lenses and intersects the user input surface at a first acute angle in a first plane;
      a third beam of coherent light emitted by a third VCSEL in the set of VCSELs passes through a second lens in the set of lenses and intersects the user input surface at a second acute angle in a second plane that differs from the first plane; and
      the set of sensors is configured to measure interferometric parameters associated with the first, second, and third beams of coherent light, and use the measured interferometric parameters to characterize a movement of a user input on the user input surface.

2. The electronic device of claim 1, wherein the interferometric parameters include at least one of a junction voltage of at least one of the VCSELs, a bias current of at least one of the VCSELs, a power output of at least one of the VCSELs, and a supply voltage for at least one of the VCSELs.

3. The electronic device of claim 1, further comprising:
   a photodetector associated with at least one VCSEL and configured to measure one of the interferometric parameters associated with the beam of coherent light of the at least one VCSEL.

4. The electronic device of claim 1, further comprising a processing unit configured to:
   receive the measured interferometric parameters of at least one sensor of the set of sensors;
   perform a spectrum analysis of the measured interferometric parameters received from the at least one sensor; and
   determine a speed of the movement and a direction of the movement based at least in part on the spectrum analysis of the measured interferometric parameters received from the at least one sensor.

5. The electronic device of claim 4, wherein:
   the determination of the speed of the movement is based at least in part on a first harmonic frequency determined by the spectrum analysis; and
   the determination of the direction of the movement is based at least in part on a phase at a second harmonic frequency determined by the spectrum analysis.

6. An electronic device comprising:
   a touch input surface;
   a module having a first wall and a second wall opposite the first wall;
   a set of lenses mounted in the first wall of the module and projecting into the module;
   a first laser housed within the module and mounted on the second wall of the module and configured to emit a first coherent light toward the touch input surface;
   a second laser housed within the module and mounted on the second wall of the module and configured to emit a second coherent light toward the touch input surface and through a first lens in the set of lenses; and
   a third laser positioned within the electronic device and configured to emit a third coherent light toward the touch input surface and through a second lens in the set of lenses;
   a set of sensors configured to detect a respective property associated with each of the first, second, and third emitted coherent lights;
   wherein:
      the second and third lasers are configured non-collinearly with respect to the first laser;
      a first detected property associated with the first coherent light is used in part to detect a deflection of the touch input surface perpendicular to the touch input surface;
      a second detected property associated with the second coherent light is used at least in part to detect a first lateral movement of the deflection of the touch input surface in a first direction; and
      a third detected property associated with the third coherent light is used at least in part to detect a second lateral movement of the deflection of the touch input surface in a second direction, the second direction being different from the first direction; and
   a reflector positioned over one of the first, second, or third VCSEL.

7. The electronic device of claim 6, wherein at least one of the first, second, or third detected property is an interferometric parameter associated with the respective first, second, or third coherent light.

8. The electronic device of claim 7, wherein the interferometric parameter is one of a junction voltage, a bias current, a power supply voltage, or a power output of the respective laser.

9. The electronic device of claim 6, further comprising a photodetector configured to detect at least one of the first, second, or third detected property.

10. The electronic device of claim 6, wherein the first, second, and third lasers are vertical-cavity surface-emitting lasers (VCSELs).

11. The electronic device of claim 10, wherein:
   the reflector comprises a reflective material on the touch input surface configured to cause reflections of the first coherent light toward the first laser; and
   the reflections of the first coherent light induce self-mixing interference within the first laser.

12. The electronic device of claim 6, further comprising a processing unit configured to:
   receive signals corresponding to the first, second, and third detected properties;
   perform a spectrum analysis of the received signals; and
   determine the first lateral movement of the deflection of the touch input surface in the first direction and the second lateral movement of the deflection of the touch input surface in the second direction based in part on the spectrum analysis.

13. The electronic device of claim 12, wherein:
a speed of the first lateral movement in the first direction is determined based in part on a first harmonic frequency determined by the spectrum analysis; and
a direction of the second lateral movement in the first direction is determined based in part on a second harmonic frequency determined by the spectrum analysis.

14. The electronic device of claim 6, further comprising:
a first lens associated with the second laser and configured to direct the emitted second coherent light to intersect the touch input surface at a first angle other than perpendicular to the touch input surface; and
a second lens associated with the third laser and configured to direct the emitted third coherent light to intersect the touch input surface at a second angle other than perpendicular to the touch input surface.

* * * * *